United States Patent
Morita

(10) Patent No.: US 7,048,801 B2
(45) Date of Patent: May 23, 2006

(54) CHEMICAL PUMP AND METHOD OF DISCHARGING CHEMICAL SOLUTION

(75) Inventor: Akihiko Morita, Kyoto (JP)

(73) Assignee: Dainippon Screen Mfg. Co., Ltd., (JP)

( * ) Notice: Subject to any disclaimer, the term of this patent is extended or adjusted under 35 U.S.C. 154(b) by 271 days.

(21) Appl. No.: 10/680,322

(22) Filed: Oct. 7, 2003

(65) Prior Publication Data
US 2004/0170772 A1 Sep. 2, 2004

(30) Foreign Application Priority Data
Oct. 16, 2002 (JP) .............................. 2002-302110

(51) Int. Cl.
*B05C 11/08* (2006.01)
*B05C 11/10* (2006.01)

(52) U.S. Cl. .................. 118/683; 118/684; 118/52; 118/319; 118/320; 417/297; 417/298; 417/555.1; 137/512

(58) Field of Classification Search ................ 118/683, 118/684, 52, 319, 320, 66; 417/297, 298, 417/473, 555.1; 137/512, 613; 427/240, 427/425

See application file for complete search history.

(56) References Cited

U.S. PATENT DOCUMENTS

| | | | |
|---|---|---|---|
| 5,167,837 A | 12/1992 | Snodgrass et al. | 210/767 |
| 5,516,429 A | 5/1996 | Snodgrass et al. | 210/767 |
| 5,772,899 A | 6/1998 | Snodgrass et al. | 210/767 |
| 6,071,094 A * | 6/2000 | Yu et al. | 417/441 |
| 6,105,829 A | 8/2000 | Snodgrass et al. | 222/214 |
| 6,109,881 A | 8/2000 | Snodgrass et al. | 417/53 |
| 6,113,695 A * | 9/2000 | Fujimoto | 118/684 |
| 6,126,338 A * | 10/2000 | Akimoto | 396/611 |
| 6,251,293 B1 | 6/2001 | Snodgrass et al. | 210/767 |
| 6,338,361 B1 * | 1/2002 | Kao et al. | 137/512 |

* cited by examiner

*Primary Examiner*—Laura Edwards
(74) *Attorney, Agent, or Firm*—Ostrolenk, Faber, Gerb & Soffen, LLP

(57) ABSTRACT

A chemical pump includes a pressure chamber, a partition member for dividing the pressure chamber into a cleaning pressure chamber and a discharging pressure chamber, a filter part disposed on the primary side of the discharging pressure chamber, and a single drive mechanism. A pair of openings with respective check valves mounted therein are provided in each of the cleaning and discharging pressure chambers, and are positioned so as to cause a resist solution to flow only in the +Z direction. The drive mechanism moves the partition member in the −X direction to cause the resist solution to be sucked into the cleaning pressure chamber and to cause the resist solution to be discharged from the discharging pressure chamber. The drive mechanism moves the partition member in the +X direction to cause the resist solution to be sucked from the filter part into the discharging pressure chamber and to cause the resist solution to be supplied from the cleaning pressure chamber to the filter part so that the sucked resist solution is equal in amount to the supplied resist solution. This prevents vapor lock and micro-bubble phenomena during the discharge of the resist solution.

8 Claims, 17 Drawing Sheets

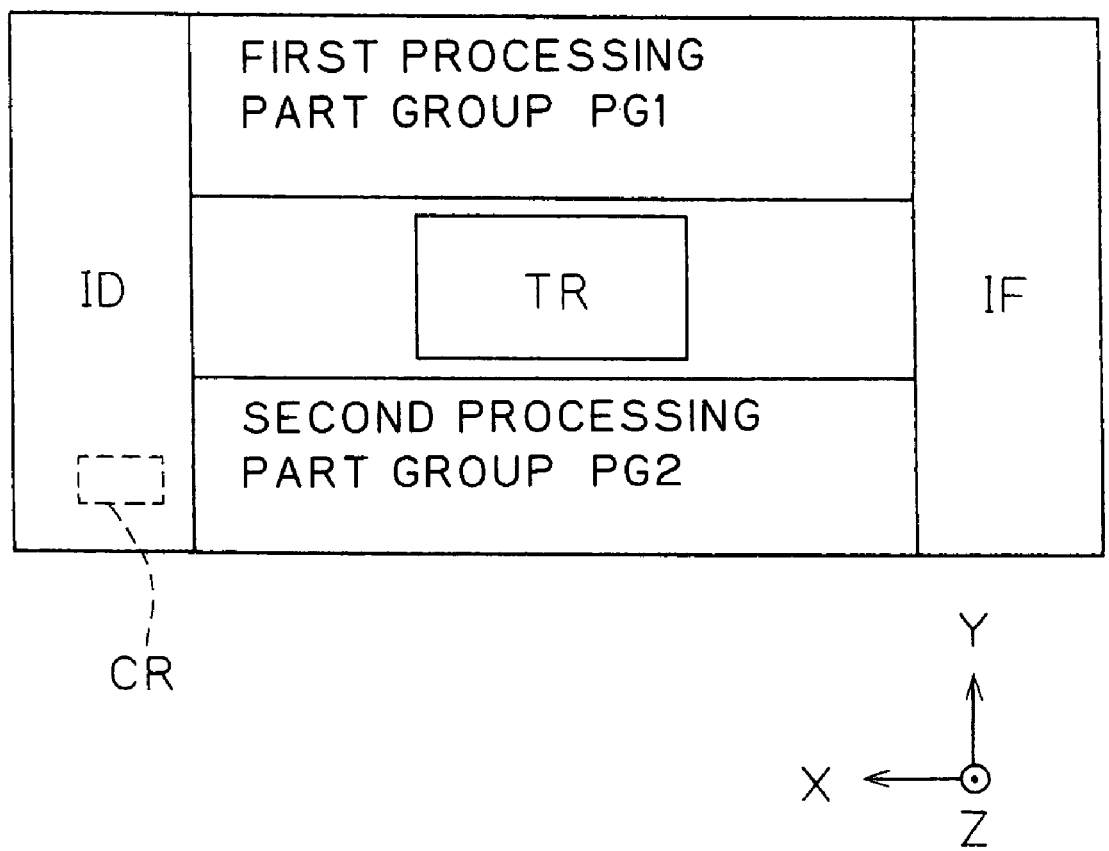
F I G . 1

FIG. 2
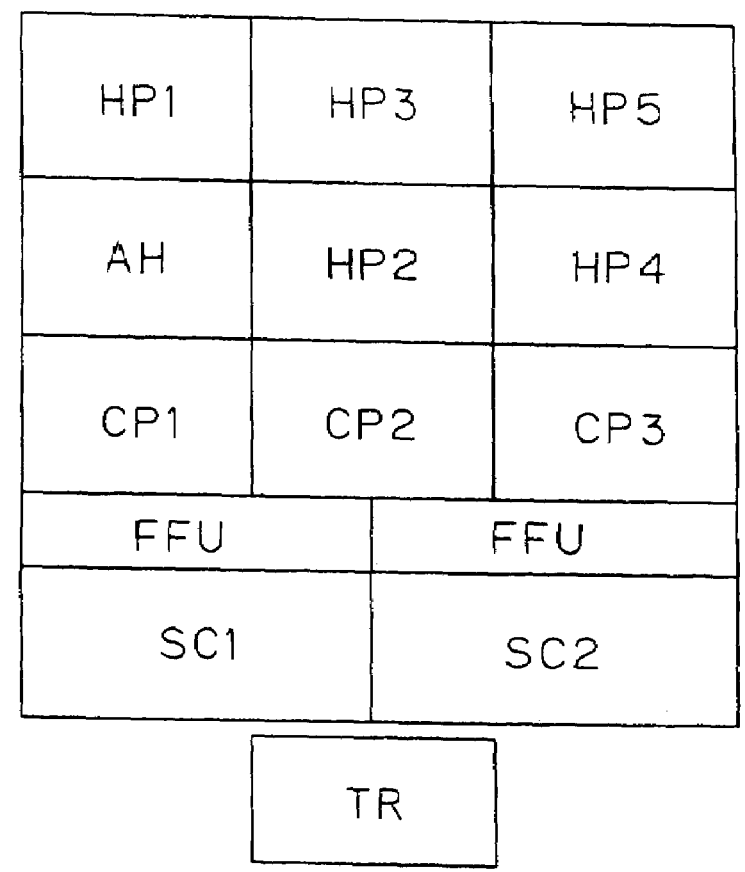
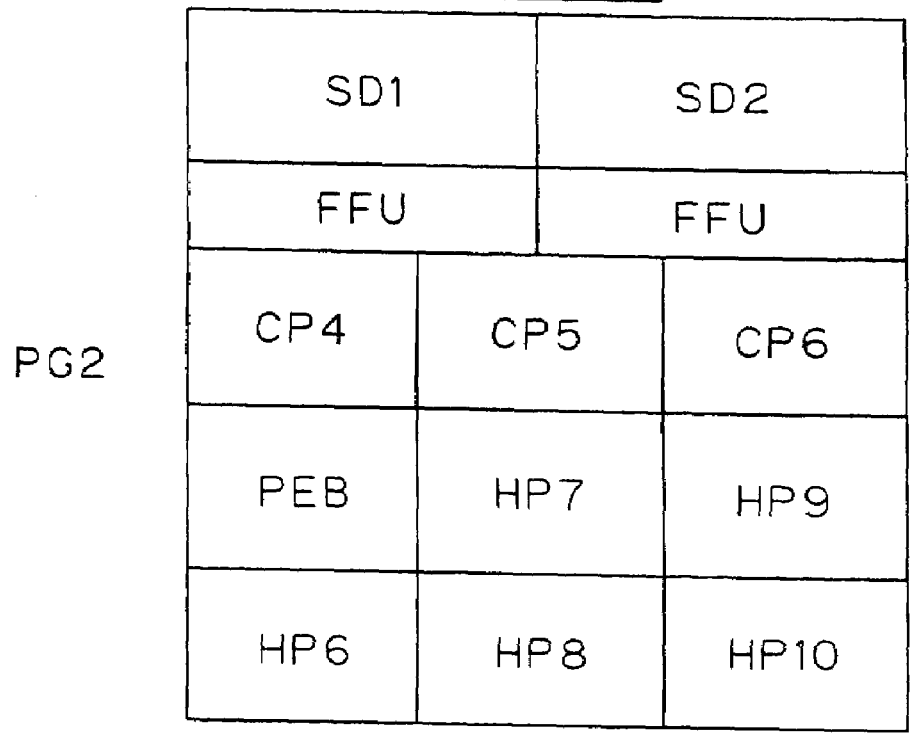

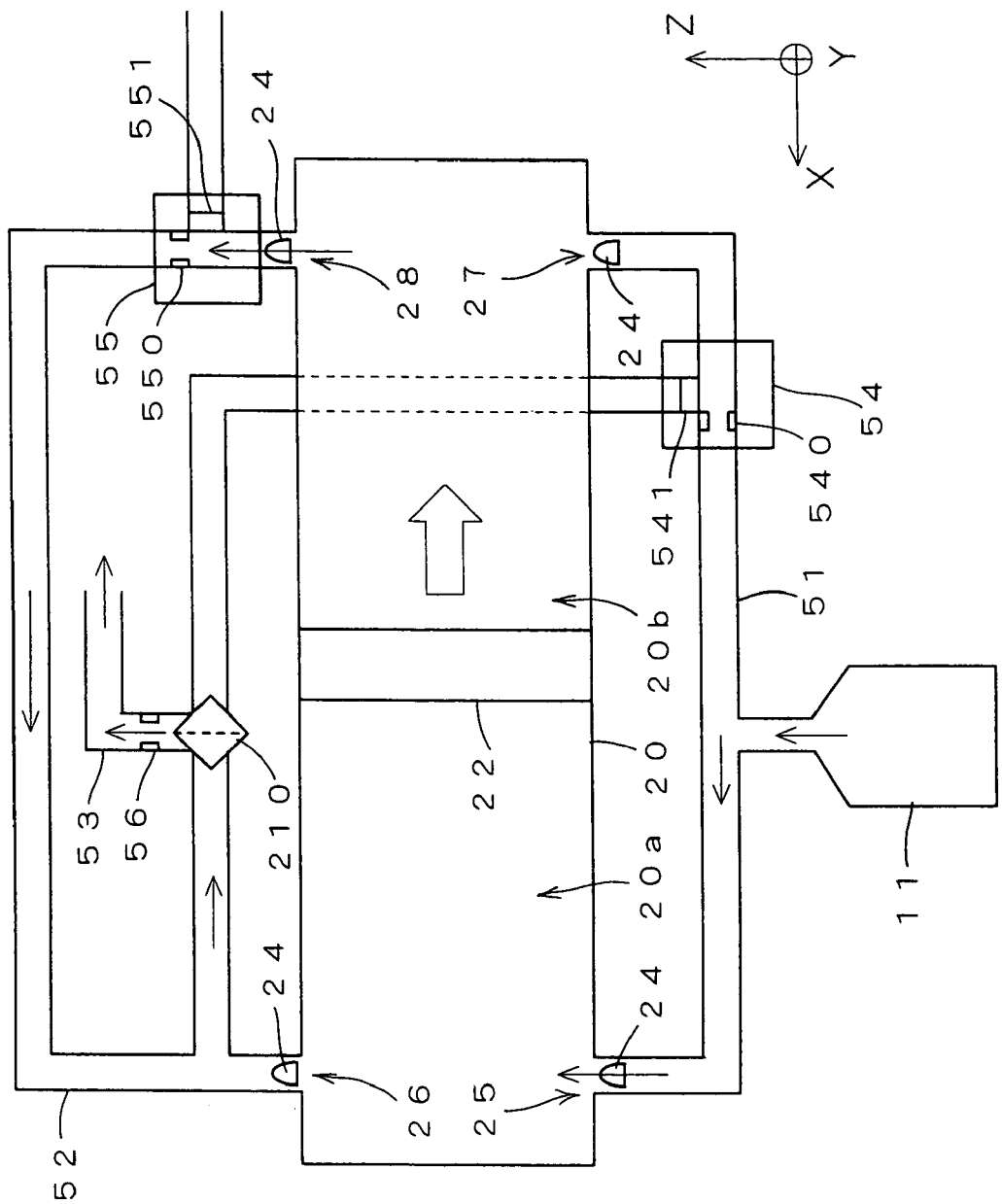

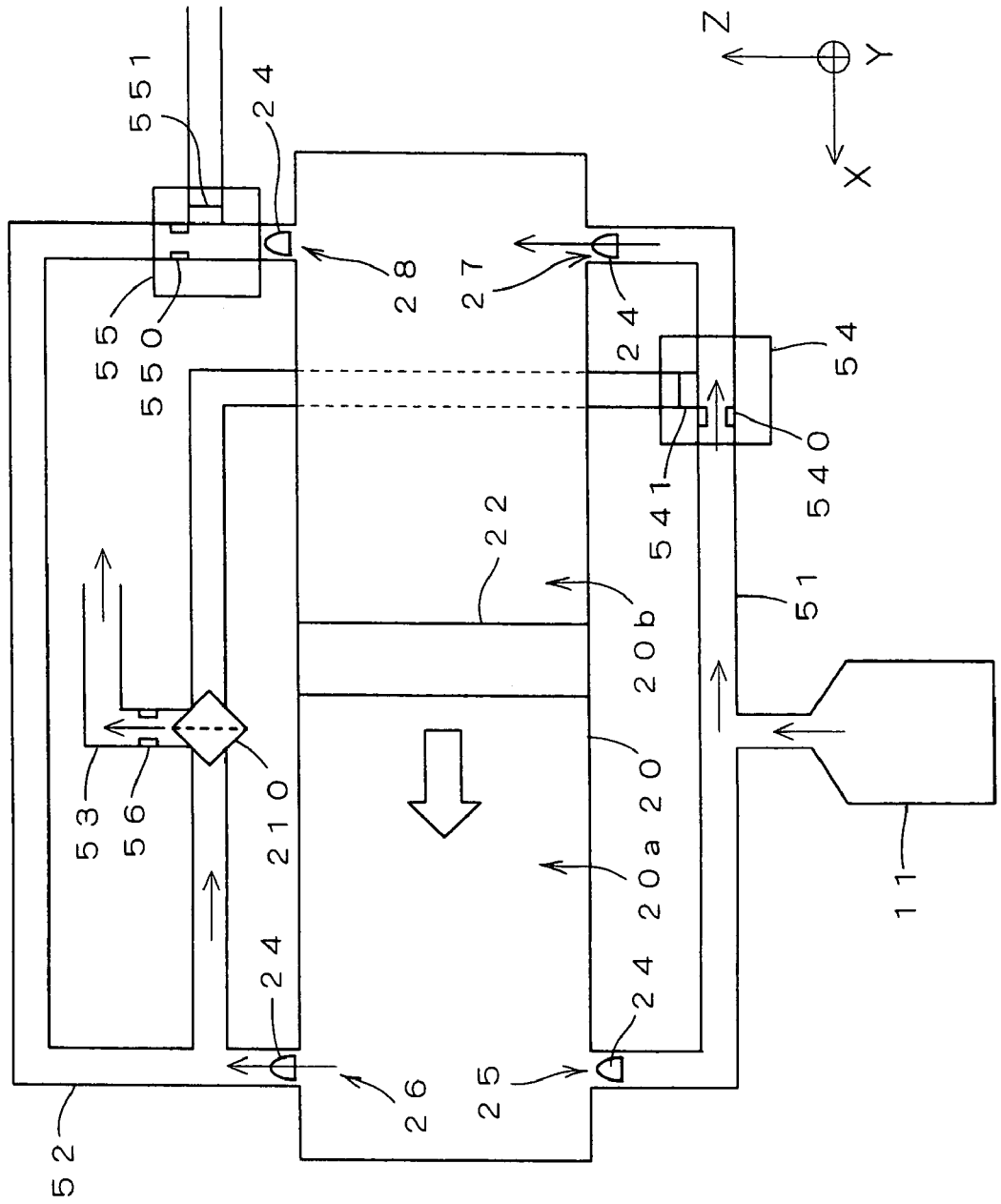

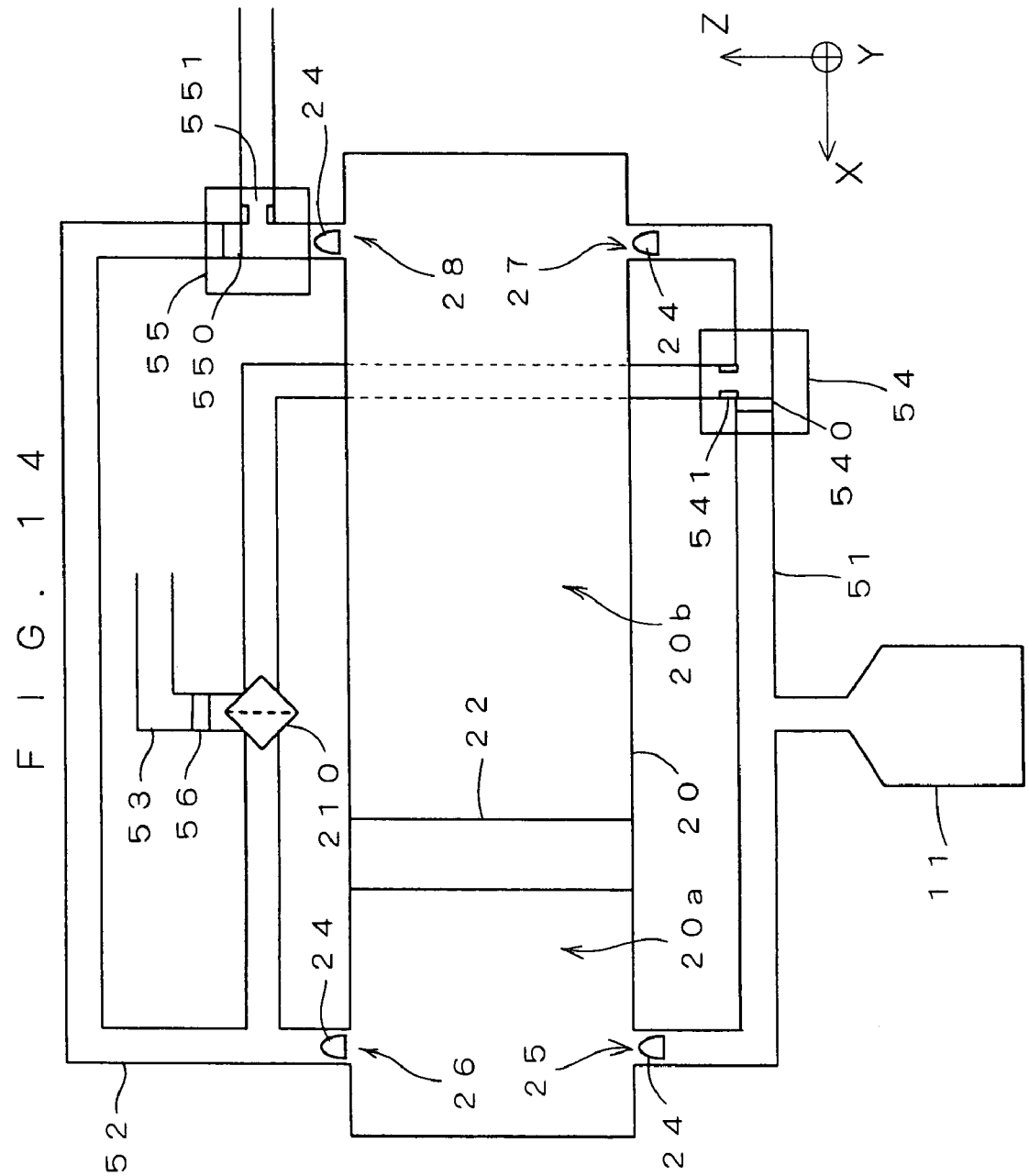

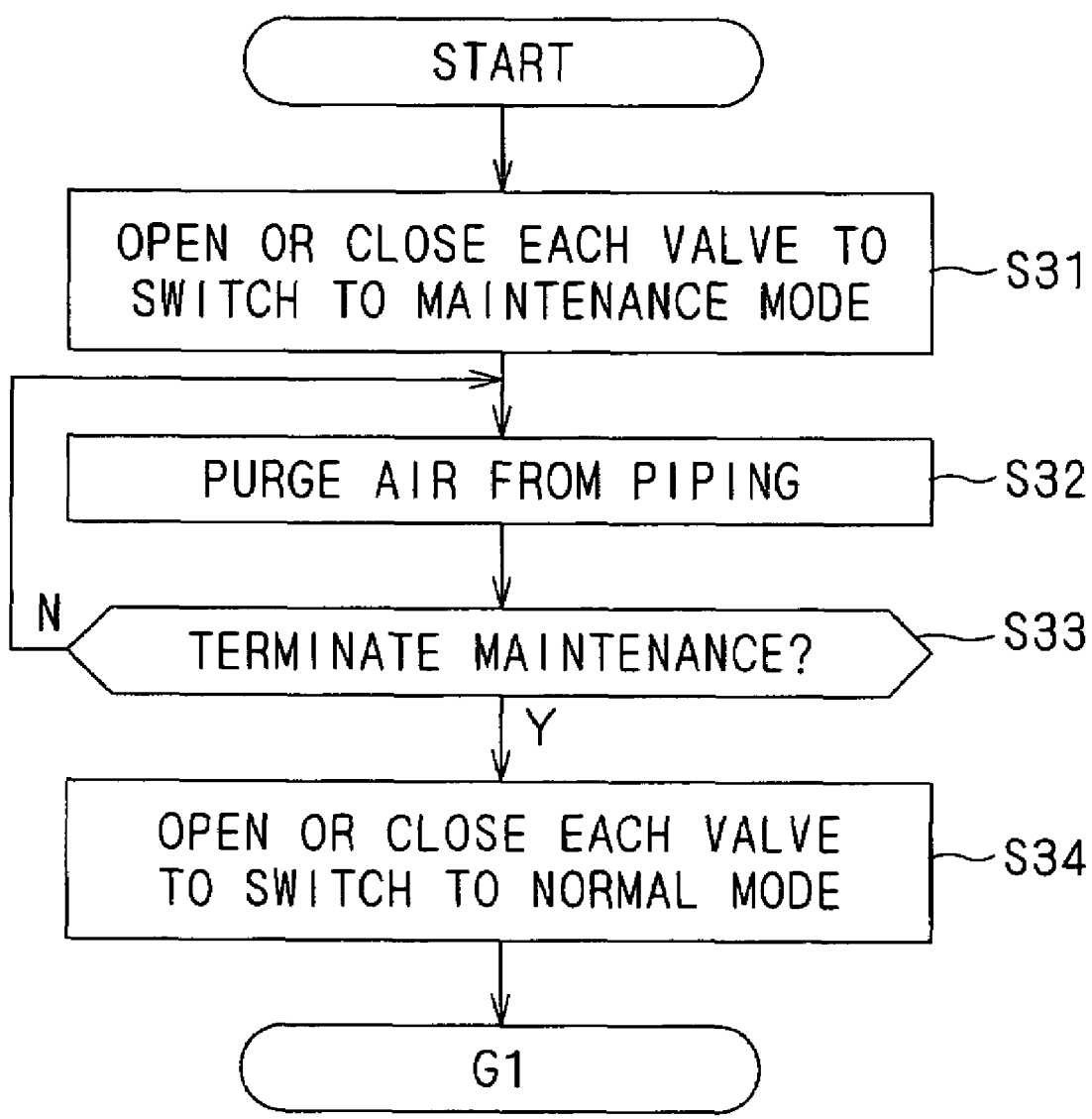

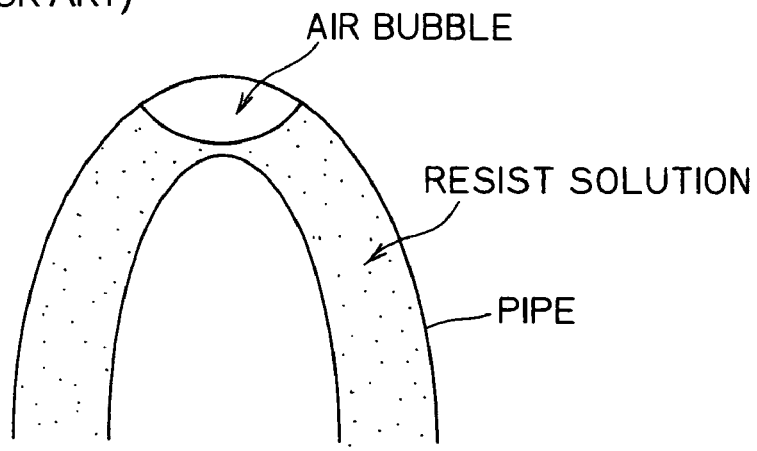
F I G. 1 9 A
(PRIOR ART)
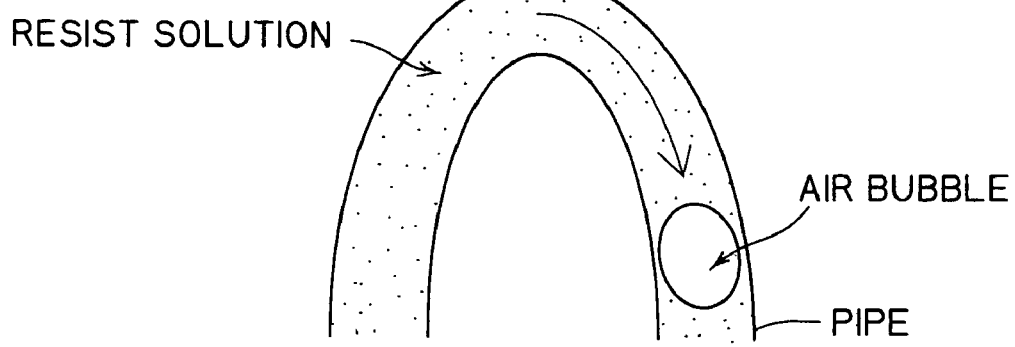
F I G. 1 9 B
(PRIOR ART)
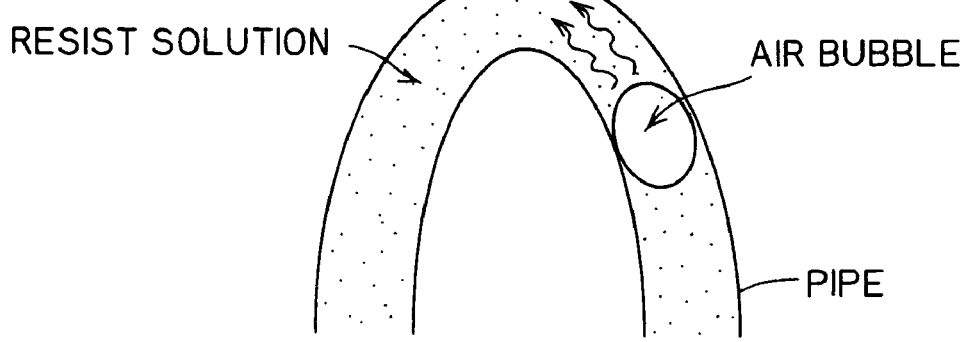
F I G. 1 9 C
(PRIOR ART)

CHEMICAL PUMP AND METHOD OF DISCHARGING CHEMICAL SOLUTION

BACKGROUND OF THE INVENTION

1. Field of the Invention

The present invention relates to a technique for discharging a chemical solution onto an objective surface of a substrate.

2. Description of the Background Art

Semiconductor products, LCD products and the like are manufactured by performing on substrates a series of processes including cleaning, resist coating, exposure, development, etching, interlayer insulation film formation, heat treatment and the like. These processes are conventionally performed in a substrate processing apparatus having incorporated therein a plurality of processing units such as a coating processing unit and a heat treatment unit. A transport robot in the substrate processing apparatus transports the substrates between the plurality of processing units in a predetermined sequence, and the processing units perform respective processes on the substrates, whereby the substrate processing sequence proceeds.

Of the processing units, a known unit for supplying chemicals (or a chemical solution) to a substrate, e.g. a coating processing unit for discharging a resist onto the substrate, includes a spin coater for coating the substrate with the chemical solution while spinning or rotating the substrate held in place. FIG. 17 shows the construction of a coating processing unit 100 which is such a typical spin coater. The coating processing unit 100 comprises a chemical bottle 101 for supplying a chemical solution such as a resist solution, an electric pump 102 for causing the resist solution to flow in a predetermined direction, a motor 103 for driving the electric pump 102, a filter 104 for removing contaminants and the like from the resist solution, a discharge valve 105 for opening and closing a flow passage of the resist solution, a nozzle 106 for discharging the resist solution toward a substrate W, a chuck 107 for holding the substrate W in position, and a spin motor 108 for rotating or spinning the substrate W held by the chuck 107.

The process of coating the surface of the substrate W with the resist solution in the coating processing unit 100 will be briefly described. The motor 103 previously drives the electric pump 102 to pump up a predetermined amount of resist solution by suction from the chemical bottle 101. Next, the spin motor 108 rotates the substrate W held by the chuck 107. The discharge valve 105 is opened and the motor 103 drives the electric pump 102, to force outwardly the predetermined amount of resist solution previously pumped up, thereby discharging the resist solution through the nozzle 106 onto the surface of the substrate W. The discharged resist solution spreads over the surface of the substrate W by centrifugal force of the substrate W to form a coating film of the resist solution on the surface of the substrate W. In this process, air bubbles, contaminants and the like are removed from the resist solution to be discharged by passing the resist solution through the filter 104.

The formation of the resist film in the substrate manufacturing process must be accurately controlled to provide a desired thickness of the resist film. To this end, precise control is effected on the discharge amount, discharge timing, discharge time and average discharge rate of the resist solution. If these values are controlled to be constant, a difference in process (mainly in discharge rate distribution during a time interval between the start of the discharge to the end thereof) results in different shapes of the formed coating films from each other, to present a problem such that the repeatability of the coating films is not insured.

The discharge rate distribution of the resist solution depends on the conditions of the filter 104 (the wettability and pressure loss of the filter 104 and the degree to which the filter 104 is clogged) disposed on the secondary side (on the nozzle 106 side) of the electric pump 102. Thus, the coating processing unit 100 presents a problem in that the quality of the coating film thickness is dependent on the change of the filter 104 with time and the quality of the filter 104.

To solve the problems, it is contemplated to provide the filter 104 on the primary side (on the chemical bottle 101 side) of the electric pump 102. FIG. 18 shows the construction of a coating unit 110 including the filter 104 disposed on the primary side. The components of the coating unit 110 are identical in function with those of the coating processing unit 100, and will not be described.

In the coating unit 110, when the resist solution is pumped out of the electric pump 102, the rate at which the resist solution is discharged from the nozzle 106 is not affected by the conditions of the filter 104 because the filter 104 is not provided on the secondary side. Thus, if the conditions for providing a desired coating film are previously determined by experiment or the like, the coating unit 110 can insure the repeatability of the discharge rate distributions of the resist solution to form a generally identical coating film in each formation operation, thereby achieving accurate control of the thickness of the coating films.

In the coating unit 110, however, the electric pump 102 sucks the resist solution under a reduced pressure. Accordingly reduced pressure within the filter 104 promotes the formation of bubbles in the resist solution within the filter 104. The coating unit 110 in which no filter is provided on the secondary side is not capable of removing the bubbles thus formed from the resist solution, to present serious problems such as vapor lock and micro-bubble phenomena, resulting in deterioration of accuracy of the coating process.

To prevent the occurrence of the vapor lock and micro-bubble phenomena in the coating process, it is important to sufficiently purge air from piping and the filter 104 upon startup of the apparatus or upon replacement of the chemical bottle 101. The electric pump 102 in each of the coating processing unit 100 and the coating unit 110 alternately performs the operation of pumping up the resist solution and the operation of pumping out the resist solution for the purpose of accurate discharge. Thus, the resist solution alternately moves and stands still repeatedly within piping.

FIGS. 19A through 19C show a bubble within a pipe during the air purge. The bubble remaining in a curved part of the pipe as shown in FIG. 19A is forced out to the position shown in FIG. 19B when the electric pump 102 drives the resist solution. However, since the resist solution stands still for some time in this state, the bubble moves up as shown in FIG. 19C and returns to the position shown in FIG. 19A. As described above, when the electric pump 102 alternately performs the pump-up and pump-out operations, air is not sufficiently purged. This results in the vapor lock and micro-bubble phenomena, to deteriorate the accuracy of the coating process.

SUMMARY OF THE INVENTION

The present invention is intended for a technique for discharging a chemical solution onto a surface (to be processed) of a substrate.

In combination with an acting element for exerting a predetermined action on a chemical solution, a chemical pump for pumping the chemical solution through the acting element, comprises: a pressure chamber divided by a movable partition member into a first chamber and a second chamber; and a single driving element for driving the partition member to reciprocate, thereby changing a volume ratio between the first chamber and the second chamber while the sum of the volumes of the first and second chambers is held constant, wherein the chemical solution sucked and introduced into the first chamber by driving the partition member in a first direction is moved via the acting element provided outside the pressure chamber into the second chamber by driving the partition member in a second direction, and is then discharged out of the second chamber by driving the partition member in the first direction again.

Thus, the single driving element drives the partition member to reciprocate, thereby changing the volume ratio between the first chamber and the second chamber while the sum of the volumes of the first and second chambers is held constant. Therefore, the chemical pump can make the amount of change in the volume of the first chamber and the amount of change in the volume of the second chamber equal to each other precisely and simultaneously, thereby to suppress vapor lock and micro-bubble phenomena without the need to provide the acting element on the secondary side of the chemical pump.

The present invention is also intended for a method of sucking and discharging a chemical solution. The method comprises the steps of: driving in a first direction a movable partition member having opposite surfaces approximately equal in surface area within a pressure chamber divided by the partition member into a first chamber and a second chamber on opposite sides of the partition member, to increase the volume of the first chamber while decreasing the volume of the second chamber, thereby sucking and introducing the chemical solution into the first chamber; driving the partition member in a second direction within the pressure chamber to decrease the volume of the first chamber while increasing the volume of the second chamber, thereby moving the chemical solution from the first chamber to the second chamber via an acting element provided outside the pressure chamber for exerting a predetermined action on the chemical solution; and causing the partition member to increase the volume of the first chamber again while decreasing the volume of the second chamber again, thereby discharging the chemical solution out of the second chamber.

Therefore, this method can make the amount of change in the volume of the first chamber and the amount of change in the volume of the second chamber equal to each other precisely and simultaneously, thereby to suppress the vapor lock and micro-bubble phenomena without the need to provide the acting element on the secondary side of the chemical pump.

It is therefore an object of the present invention to prevent vapor lock and micro-bubble phenomena during the discharge of a chemical solution.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view showing the overall construction of a substrate processing apparatus according to the present invention;

FIG. 2 shows the construction of a first processing part group and a second processing part group of the substrate processing apparatus shown in FIG. 1;

FIGS. 12 through 14 show a chemical pump and a piping system according to a fourth preferred embodiment of the present invention;

FIGS. 15 and 16 are flowcharts showing the operation of the coating processing unit according to the fourth preferred embodiment;

FIGS. 19A, 19B and 19C show a bubble in a pipe during air purge in a background art unit.

DESCRIPTION OF THE PREFERRED EMBODIMENTS

Figure 3:
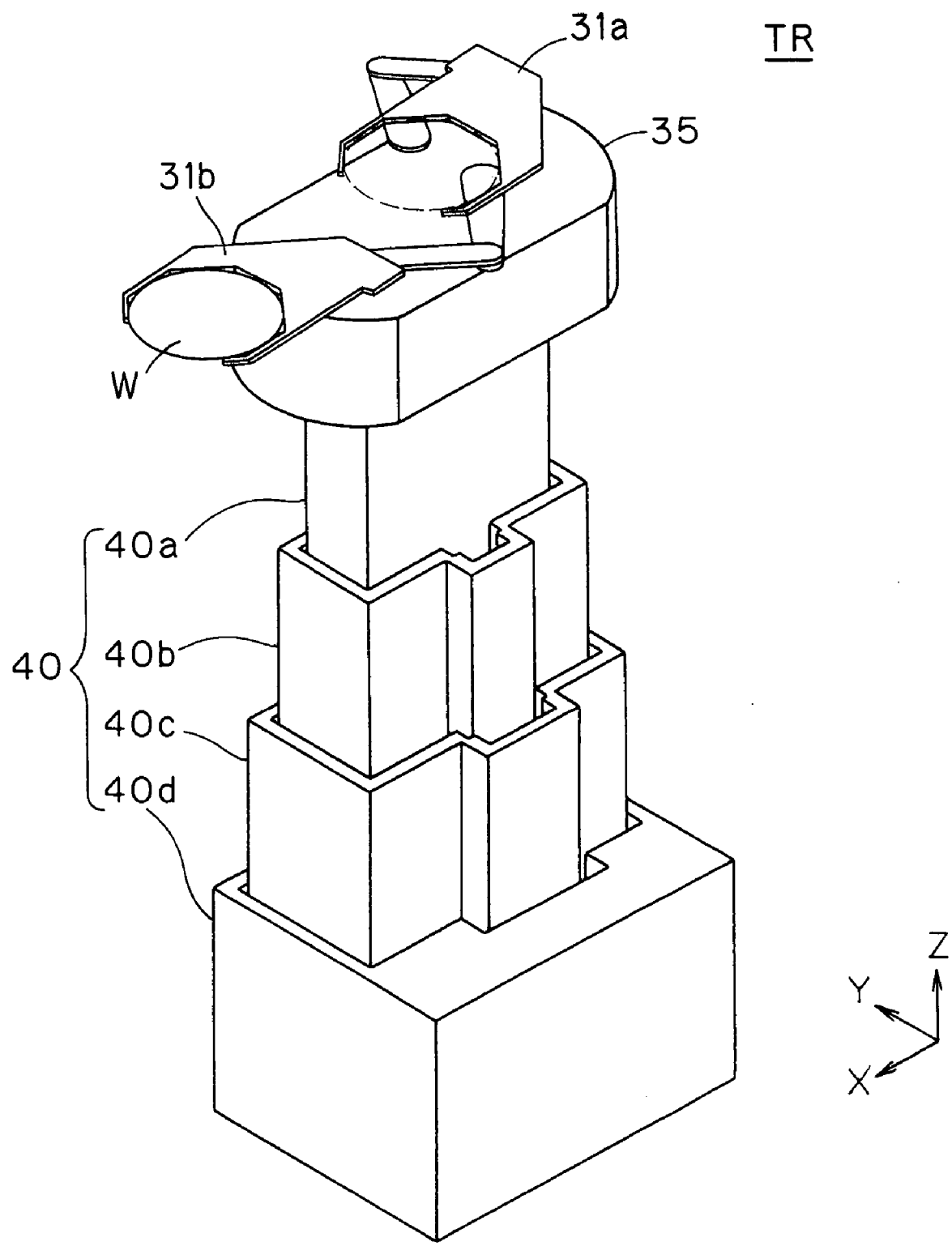
FIG. 3 is an external perspective view of a transport robot of the substrate processing apparatus of FIG. 1.

FIG. 1 is a plan view showing the overall construction of a substrate processing apparatus 1 according to a preferred embodiment of the present invention. For the sake of definiteness of directions relative to each other, an XYZ rectangular coordinate system is illustrated, as required, in FIG. 1 and its subsequent figures.

The substrate processing apparatus 1 performs a resist coating process and a development process on objective surfaces of respective substrates. The substrate processing apparatus 1 comprises: an indexer ID for transporting the substrates into and out of the substrate processing apparatus 1; a first processing part group PG1 and a second processing part group PG2 each including a plurality of processing units for performing processes on the substrates; an interface IF for transferring the substrates to and from an exposure apparatus (or a stepper) not shown; and a transport robot TR.

The substrates to be processed by the substrate processing apparatus 1 are circular semiconductor substrates (or wafers) for fabrication of electronic components such as LSIs. However, the substrate processing apparatus 1 may be used in modified form as an apparatus for performing the above-mentioned processes on rectangular glass substrates for fabrication of display panels of LCD devices or on various substrates for flat panel displays.

The indexer ID places thereon a cassette or carrier (not shown) which can accommodate a plurality of substrates, and includes a transfer robot. The indexer ID transfers an unprocessed substrate from the cassette to the transport robot TR, and receives a processed substrate from the transport robot TR to store the processed substrate in the cassette. The cassette may be of the following types: an OC (open cassette) which exposes the stored substrates to atmosphere; and a FOUP (front opening unified pod) and an SMIF (standard mechanical interface) pod which store substrates in an enclosed or sealed space. In this preferred embodiment, the cassette stores 25 substrates therein.

The interface IF has the functions of receiving a substrate subjected to the resist coating process from the transport robot TR to pass the substrate to an exposure apparatus not shown, and of receiving an exposed substrate from the exposure apparatus to pass the exposed substrate to the transport robot TR. The interface IF further has a buffer function for temporarily stocking therein substrates before and after exposure so as to adjust the time at which the substrates are transferred to and from the exposure apparatus. The interface IF comprises a robot for transferring the substrates from and to the transport robot TR, and a buffer cassette for placing the substrates thereon, although not shown.

The substrate processing apparatus 1 comprises a plurality of processing units (processing parts) for processing substrates. Some of the plurality of processing units constitute the first processing part group PG1, and the remaining processing units constitute the second processing part group PG2. FIG. 2 shows the construction of the first processing part group PG1 and the second processing part group PG2. The first processing part group PG1 includes coating processing units SC1 and SC2 (or resist coating processing parts) serving as solution processing units, and a plurality of heat treatment units disposed over the coating processing units SC1 and SC2. Although shown as disposed in a horizontal plane in FIG. 2 for purposes of illustration, the processing units are actually stacked in a vertical direction (in the Z direction).

Each of the coating processing units SC1 and SC2 is a so-called spin coater for supplying a photoresist (or a chemical solution) onto a main surface of a substrate while rotating the substrate to provide uniform resist coating. The coating processing units SC1 and SC2 have incorporated therein a chemical pump and a piping system according to the present invention which will be described in detail later.

The heat treatment units are arranged in three stacks of three each and provided over the coating processing units SC1 and SC2. Specifically, a first stack includes a cooling unit CP1, an adhesion promotion unit AH (or an adhesion promotion processing part) and a heating unit HP1, in bottom-to-top order. A second stack includes a cooling unit CP2, a heating unit HP2 and a heating unit HP3, and a third stack includes a cooling unit CP3, a heating unit HP4 and a heating unit HP5, in bottom-to-top order.

Similarly, the second processing part group PG2 includes development processing units SD1 and SD2 serving as solution processing units, and a plurality of heat treatment units disposed over the development processing units SD1 and SD2. Each of the development processing units SD1 and SD2 is a so-called spin developer for supplying a developing solution onto the exposed substrate to perform a development process. The heat treatment units are arranged in three stacks of three each, and provided over the development processing units SD1 and SD2. Specifically, a first stack includes a cooling unit CP4, a post-exposure baking unit PEB and a heating unit HP6, in bottom-to-top order. A second stack includes a cooling unit CP5, a heating unit HP7 and a heating unit HP8, and a third stack includes a cooling unit CP6, a heating unit HP9 and a heating unit HP10, in bottom-to-top order.

The heating units HP1 to HP10 are so-called hot plates for heating a substrate up to a predetermined temperature. The adhesion promotion unit AH and the post-exposure baking unit PEB are heating units for heating a substrate before the resist coating process and immediately after the exposure, respectively. The cooling units CP1 to CP6 are so-called cool plates for cooling a substrate down to a predetermined temperature, and for maintaining the substrate at the predetermined temperature.

The processing units (heating units and cooling units) for adjusting the temperature of a substrate are referred to herein as the heat treatment units. The processing units for supplying a chemical solution to a substrate to perform a predetermined process, such as the coating processing units SC1 and SC2 and the development processing units SD1 and SD2, are referred to herein as the solution processing units. The solution processing units and the heat treatment units are generically referred to as processing units.

Filter fan units FFU for forming a downflow of clean air at controlled temperature and humidity toward the solution processing units are provided immediately under the heat treatment units. Although not shown, a filter fan unit for forming a downflow of clean air toward a transport space is also provided over the transport robot TR.

A controller CR is provided in the substrate processing apparatus 1. The controller CR is constructed using a computer including a memory, a CPU and the like. The controller CR controls the transport operation of the transport robot TR in accordance with a predetermined processing program, and gives instructions to the processing units to establish processing conditions.

FIG. 3 is an external perspective view of the transport robot TR. The transport robot TR includes a telescopic body 40 having a telescopically nested multi-section structure, and an arm stage 35 provided on top of the telescopic body 40 and having transport arms 31a and 31b.

The telescopic body 40 has four sections 40a, 40b, 40c and 40d, in top-to-bottom order. The section 40a is receivable in the section 40b, and the section 40b is receivable in the section 40c which in turn is receivable in the section 40d. Sliding the sections 40a to 40d one into another shortens the telescopic body 40 into a retracted position, whereas sliding the sections 40a to 40d one out of another elongates the telescopic body 40 into an extended position. Specifically, when the telescopic body 40 is in the retracted position, the section 40a is received in the section 40b, and the section 40b is received in the section 40c which in turn is received in the section 40d. When the telescopic body 40 is in the extended position, on the other hand, the section 40a is substantially extended from the section 40b, and the section 40b is substantially extended from the section 40c which in turn is substantially extended from the section 40d.

The extendable/retractable operation of the telescopic body 40 is achieved by an elevating mechanism provided therein. An example of the elevating mechanism used herein may include a mechanism wherein a multiple belt and roller assembly is driven by a motor. The transport robot TR uses such an elevating mechanism to vertically move the transport arms 31a and 31b.

The transport robot TR is also capable of accomplishing the horizontal back-and-forth movement and the pivotal movement of the transport arms 31a and 31b. Specifically, the arm stage 35 on top of the section 40a accomplishes the horizontal back-and-forth movement and the pivotal movement of the transport arms 31a and 31b. More specifically, the arm stage 35 folds and unfolds the arm segments of the transport arms 31a and 31b to accomplish the horizontal back-and-forth movement of the transport arms 31a and 31b, and the arm stage 35 itself pivots with respect to the telescopic body 40 to accomplish the pivotal movement of the transport arms 31a and 31b.

Thus, the transport robot TR is capable of accomplishing the vertical movement, the pivotal movement and the horizontal back-and-forth movement of the transport arms 31a and 31b. In other words, the transport robot TR is capable of moving the transport arms 31a and 31b in three dimensions. The transport arms 31a and 31b holding a substrate W move in three dimensions to transfer the substrate to and from the plurality of processing units, thereby allowing the substrate W to be transported to the plurality of processing units and to be subjected to various processes.

Figure 4:
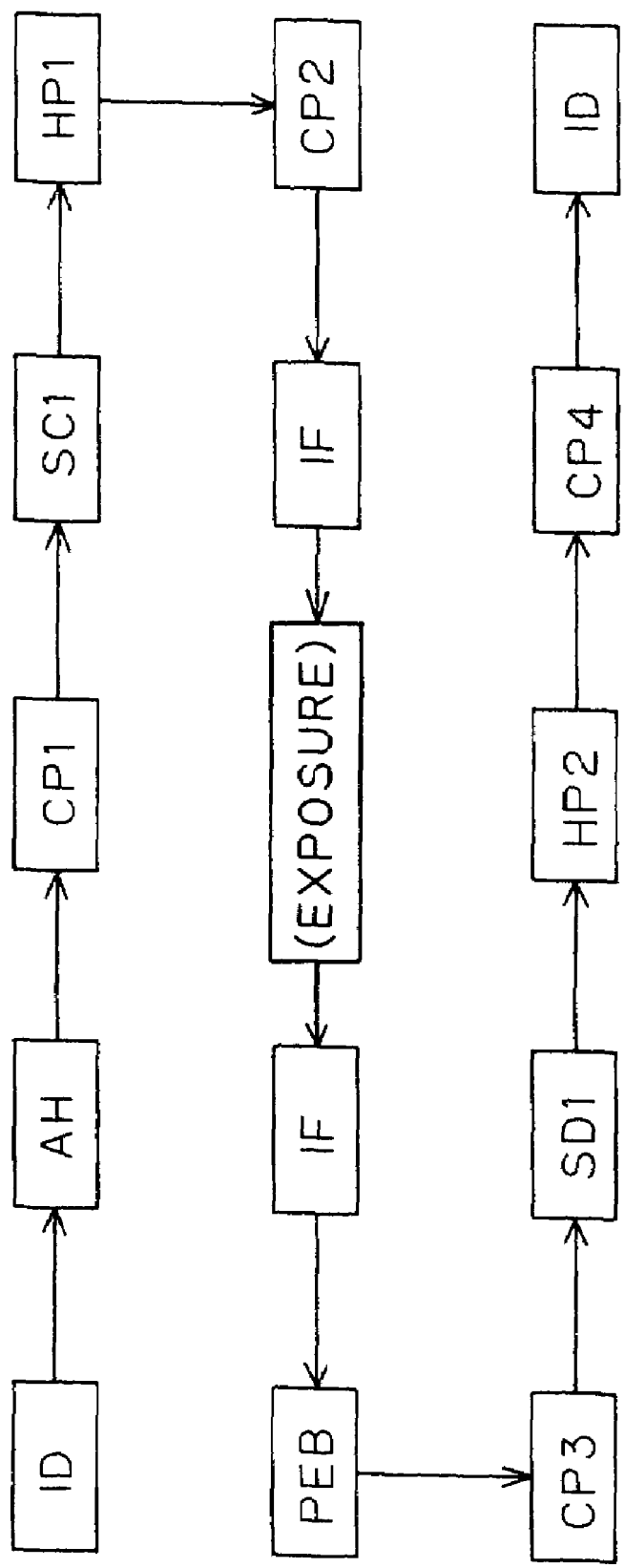
FIG. 4 shows an example of a substrate processing procedure in the substrate processing apparatus of FIG. 1.

Next, a substrate processing procedure in the aforementioned substrate processing apparatus 1 will be briefly described. FIG. 4 shows an example of the substrate processing procedure in the substrate processing apparatus 1. First, an unprocessed substrate W transferred from the indexer ID to the transport robot TR is transported into the adhesion promotion unit AH. The adhesion promotion unit AH is an adhesion promotion processing part for performing a heating process on the substrate W to promote the adhesion of the resist to the substrate W. To be precise, the adhesion promotion unit AH sprays vaporized HMDS (hexamethyl disilazane) onto the heated substrate W to promote the adhesion. Next, the transport robot TR transports the substrate W subjected to the adhesion promotion process from the adhesion promotion unit AH to the cooling unit CP1. The cooling unit CP1 is a cool plate for performing a cooling process on the substrate W heated by the adhesion promotion unit AH.

Then, the transport robot TR transports the substrate W subjected to the cooling process from the cooling unit CP1 to the coating processing unit SC1. The coating processing unit SC1 is constructed as a so-called spin coater for applying a resist solution to a main surface of the substrate W while rotating the substrate W to coat the main surface of the substrate W with the resist solution. The applied resist solution spreads over the main surface of the substrate W by centrifugal force to form a resist film.

Next, the transport robot TR transports the substrate subjected to the resist coating process from the coating processing unit SC1 to the heating unit HP1. The heating unit HP1 is a hot plate for performing a heating process on the substrate W coated with the resist by the coating processing unit SC1. This heating process is heat treatment known as a prebake which evaporates excess solvent components in the resist applied to the substrate W to provide firm adhesion of the resist to the substrate W, thereby forming the resist film having stable sensitivity.

The transport robot TR transports the substrate W subjected to the prebake from the heating unit HP1 to the cooling unit CP2. The cooling unit CP2 performs a cooling process on the substrate W subjected to the prebake.

After the cooling process, the transport robot TR transports the substrate W from the cooling unit CP2 to the interface IF. The interface IF passes to the exposure apparatus (or the stepper) the substrate W formed with the resist film and received from the transport robot TR. The exposure apparatus performs an exposure process on the substrate W. The substrate W after the exposure process is passed from the exposure apparatus back to the interface IF.

The transport robot TR transports the substrate W passed back to the interface IF to the post-exposure baking unit PEB. The post-exposure baking unit PEB performs heat treatment (post-exposure bake) for uniformly diffusing products resulting from a photochemical reaction within the resist film. This heat treatment eliminates the nonuniformity of the resist on boundaries between exposed and unexposed portions to provide a good pattern.

The transport robot TR transports the substrate W subjected to the post-exposure bake from the post-exposure baking unit PEB to the cooling unit CP3. The cooling unit CP3 performs a cooling process on the substrate W subjected to the post-exposure bake. Thereafter, the transport robot TR transports the substrate W from the cooling unit CP3 to the development processing unit SD1. The development processing unit SD1 performs a development process on the exposed substrate W.

The transport robot TR then transports the developed substrate W from the development processing unit SD1 to the heating unit HP2. The heating unit HP2 heats the developed substrate W. Thereafter, the transport robot TR transports the substrate W from the heating unit HP2 to the cooling unit CP4 which in turn cools the substrate W.

The substrate W cooled by the cooling unit CP4 is transferred by the transport robot TR back to the indexer ID and stored into a cassette.

As described above, the transport robot TR transports the substrate W in accordance with the procedure shown in FIG. 4, whereby the substrate W is subjected to a series of processes including the resist coating process, the development process and accompanying heat treatment. In the procedure of FIG. 4, the coating processing unit SC2 similar in function to the coating processing unit SC1 may be used in place of the coating processing unit SC1. Parallel processing may be performed such that the substrate W is transported into an empty one of the coating processing units SC1 and SC2. This holds true for the development processing unit SD1, the heating unit HP1, the cooling unit CP1 and the like which have equivalent processing units similar in function thereto.

The overall construction of the substrate processing apparatus 1 and the outline of the processing procedure in the substrate processing apparatus 1 have been described above. Next, the coating processing unit SC1 provided in the substrate processing apparatus 1 will be described in detail. Although only the coating processing unit SC1 will be described below, the coating processing unit SC2 is similar to the coating processing unit SC1.

Figure 5:
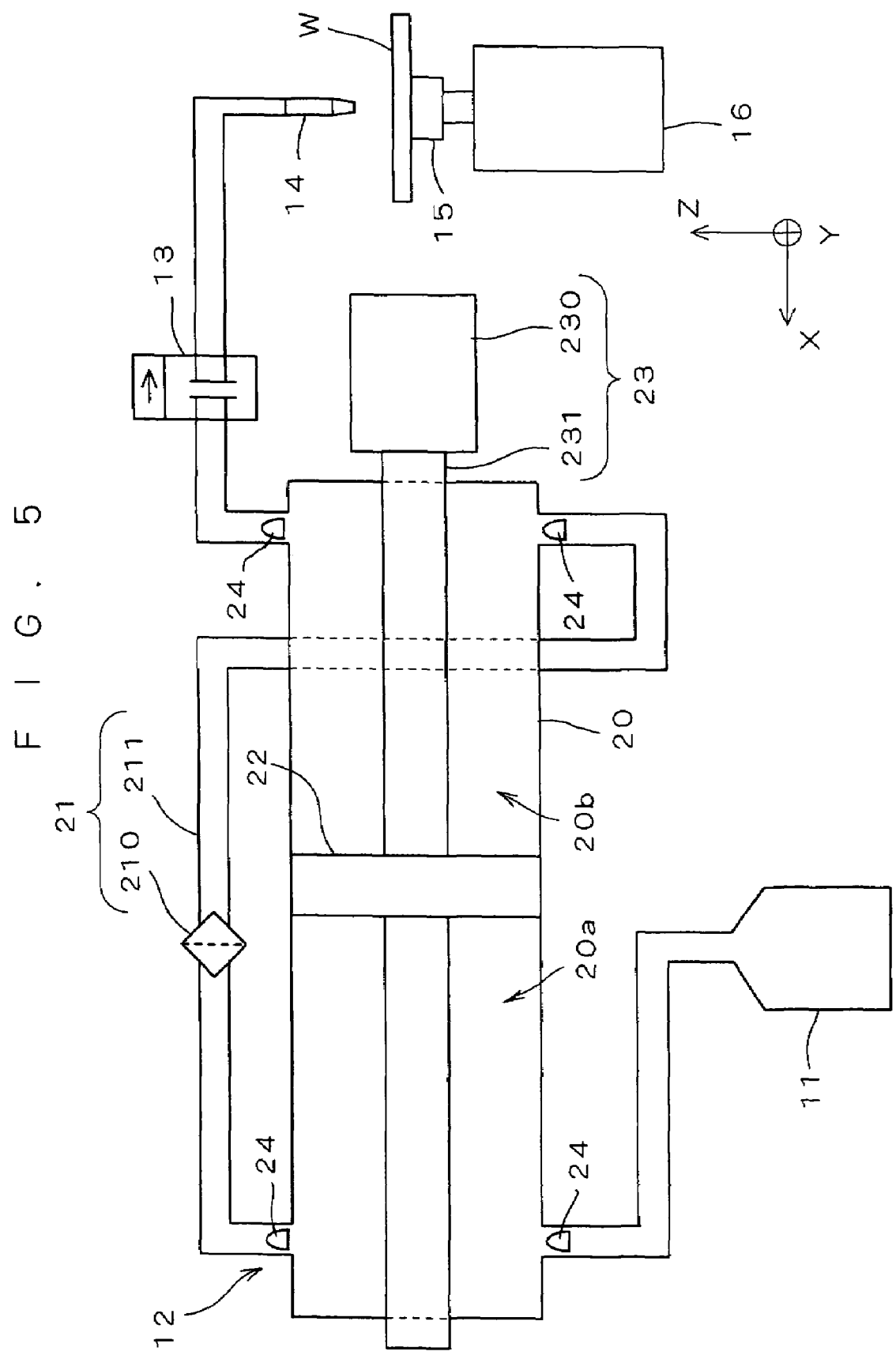
FIG. 5 shows the construction of principal parts of a coating processing unit of the substrate processing apparatus of FIG. 1.

FIG. 5 shows the construction of principal parts of the coating processing unit SC1 according to a first preferred embodiment of the present invention. The coating processing unit SC1 is constructed as a so-called spin coater for applying a resist solution serving as a chemical solution to the surface of a substrate W while rotating the substrate W in the process of selectively etching electrode layers and the like formed on the surface of the substrate W.

The coating processing unit SC1 comprises: a chemical bottle 11 for storing the resist solution; a chemical pump 12 for discharging the resist solution pumped up (or sucked) from the chemical bottle 11 while pressurizing the resist solution; a discharge valve 13 for opening and closing a flow passage (or a pipe) of the resist solution; a nozzle 14 for discharging the resist solution toward the substrate W; a chuck 15 for holding the substrate W in position; and a spin motor 16 for rotating or spinning the substrate W.

Figure 6:
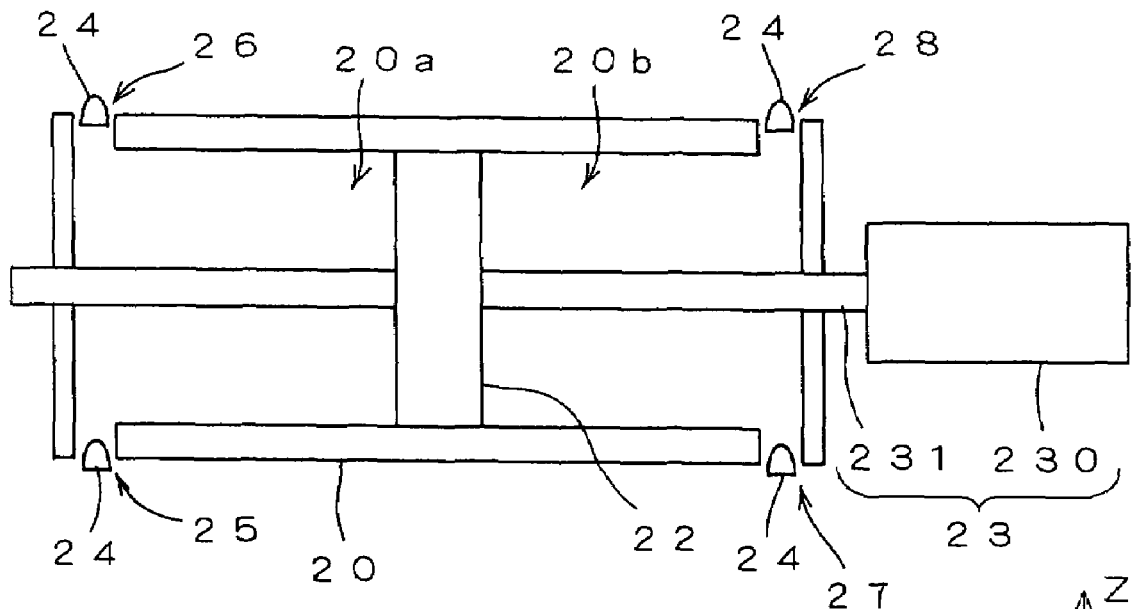
FIG. 6 is a schematic view of a chemical pump according to a first preferred embodiment of the present invention.

The chemical pump 12 includes a pressure chamber 20 for reducing and exerting pressure on the resist solution, and a filter part 21 serving as an acting element. FIG. 6 shows the construction of the pressure chamber 20 of the chemical pump 12. The pressure chamber 20 is provided with a partition member 22, a drive mechanism 23, and a plurality of check valves 24.

The pressure chamber 20 is made of a rigid material and has a hollow interior structure. The interior space of the pressure chamber 20 (having a volume V) is shaped so that the cross-sectional area S thereof substantially parallel to the Y-Z plane is constant along the X axis, and is divided by the partition member 22 into a cleaning pressure chamber 20a (having a volume Va) and a discharging pressure chamber 20b (having a volume Vb).

The filter part 21 is provided outside the pressure chamber 20. The filter part 21 includes a pipe 211 for providing communication between the cleaning pressure chamber 20a and the discharging pressure chamber 20b, and a filter 210 inserted in the pipe 211 for removing bubbles and contaminants from the resist solution passing through the pipe 211 to clean the resist solution. Since the pipe 211 establishes a connection between the cleaning pressure chamber 20a and the discharging pressure chamber 20b as shown in FIG. 5, the resist solution passes through the cleaning pressure chamber 20a and the discharging pressure chamber 20b in order, which will be described in detail later. The coating processing unit SC1 in the first preferred embodiment includes the filter part 21 serving as the acting element for exerting a predetermined action on the chemical solution. However, the acting element is not limited to the filter part 21 but may be, for example, a device for adjusting the temperature of the chemical solution. Such an acting element may be construed as a conditioner for adjusting the conditions of the chemical solution or as a converter for converting the physical or chemical properties of the chemical solution.

The partition member 22 is made of a material impermeable to the resist solution, and has an outer peripheral portion in intimate contact with the inner walls of the pressure chamber 20 to prevent the resist solution from directly passing between the cleaning pressure chamber 20a and the discharging pressure chamber 20b. Specifically, both a surface area Sa of the partition member 22 on the cleaning pressure chamber 20a side and a surface area Sb thereof on the discharging pressure chamber 20b side are equal to the cross-sectional area S of the pressure chamber 20. Thus, the partition member 22 has the function of blocking the passage of the resist solution. The partition member 22 is integrally constructed of a material which undergoes a negligible change in volume and shape, and the positions of the surfaces of the partition member 22 on the cleaning pressure chamber 20a side and on the discharging pressure chamber 20b side relative to each other are unchanged. The material which undergoes a negligible change in volume and shape is termed in this preferred embodiment with the intention of permitting some alteration such as expansion and shrinkage due to temperature change and a change in shape due to wear. This term means that metal and alloys having a predetermined hardness or higher, ceramic, and the like apply to the above-mentioned material, but an elastic material such as rubber and a plastic material such as clay are excluded.

The drive mechanism 23 includes a motor 230 for generating a driving force for moving the partition member 22, and a guide member 231 for defining the direction of movement of the partition member 22. The motor 230 is capable of precisely controlling the direction, amount and speed of rotation, based on a control signal from the controller CR.

This effects more precise control of the direction, distance and speed of movement of the partition member 22 as compared with, for example, a cylinder mechanism which moves the partition member 22.

The guide member 231 is a shaft-like member whose cross-sectional area in the Y-Z plane is constant at any position along the X axis, and is disposed within the pressure chamber 20 so as to extend through the pressure chamber 20 in a direction substantially parallel to the X axis, as shown in FIG. 6. The guide member 231 has the functions of transferring the driving force of the motor 230 to the partition member 22 and limiting the direction of movement of the partition member 22 to the X direction.

The drive mechanism 23 having such a construction smoothly reciprocates the partition member 22 in the X direction to make the volume Va of the cleaning pressure chamber 20a and the volume Vb of the discharging pressure chamber 20b variable, whereby the ratio between the volumes Va and Vb may be varied at will.

This provides variable volumes of the cleaning pressure chamber 20a and the discharging pressure chamber 20b. When the volume of each of the chambers 20a and 20b is increased, the pressure in each of the chambers 20a and 20b is reduced to cause the resist solution to be sucked. When the volume is decreased, on the other hand, pressure is applied to the interior of each of the chambers 20a and 20b to cause the resist solution to be discharged. The drive mechanism 23 (principally, the guide member 231) is made of a material which undergoes a negligible change in volume and shape, like the partition member 22, and is disposed so that the volume and shape thereof within the pressure chamber 20 are not changed by the movement of the partition member 22, as shown in FIG. 6. Specifically, the drive mechanism 23 has the function of driving the partition member 22 to thereby change the volume ratio between the cleaning pressure chamber 20a and the discharging pressure chamber 20b so that the sum of the volumes of the cleaning pressure chamber 20a and the discharging pressure chamber 20b (or the volume of the pressure chamber 20) is constant as expressed by $$Va + Vb = V = \text{const.} \tag{1}$$

Figure 7:
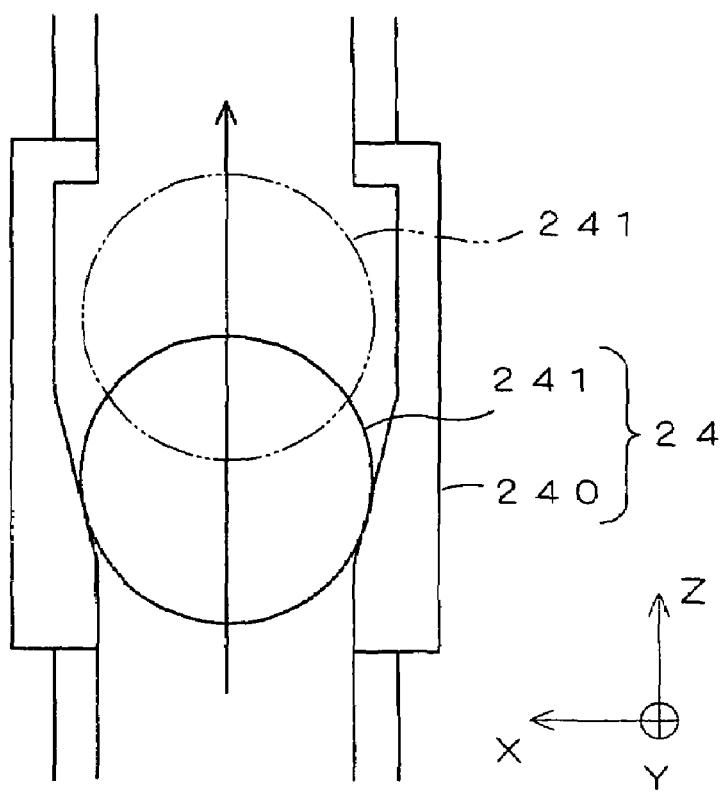
FIG. 7 shows a structure of a check valve.

A check valve 24 is provided in each opening 25 to 28 provided in the pressure chamber 20, as shown in FIG. 6. FIG. 7 shows the details of the check valve 24. The check valve 24 includes an enclosure 240 in a short tubular form, and a sphere 241 disposed in the enclosure 240 movably in the Z direction. Openings of the enclosure 240 are connected to, for example, pipes for the resist solution so that the interior of the enclosure 240 serves as a flow path of the resist solution.

The interior space of the enclosure 240 becomes narrower in the −Z direction to prevent the sphere 241 from moving beyond a shut-off position (indicated by the solid line of FIG. 7) in the −Z direction. A stopper member not shown prevents the sphere 241 from moving beyond the position indicated by the dash-double-dot line of FIG. 7 in the +Z direction. When in the shut-off position, the sphere 241 shuts off the interior of the enclosure 240 (or the flow path of the resist solution) to prevent the resist solution from flowing, as shown in FIG. 7. Thus, the check valve 24 permits the resist solution to flow only in the +Z direction (indicated by the arrow of FIG. 7). The structure of the check valve 24 is not limited to that shown in FIG. 7, but may be such that the controller CR controls the opening and closing of the flow path of the resist solution as in a solenoid valve. Any known structure may be used which functions to cause the resist solution to flow only in a predetermined direction in predetermined timed relation.

Thus, the opening 25 serves as the inlet of the cleaning pressure chamber 20a for the resist solution, and the opening 26 serves as the outlet thereof. The opening 27 serves as the inlet of the discharging pressure chamber 20b for the resist solution, and the opening 28 serves as the outlet thereof. For example, when pressure is applied to the cleaning pressure chamber 20a, the resist solution in the cleaning pressure chamber 20a is forced outwardly through the opening 26 serving as the outlet but is not forced outwardly through the opening 25 serving as the inlet because of the presence of the check valves 24.

Figure 8:
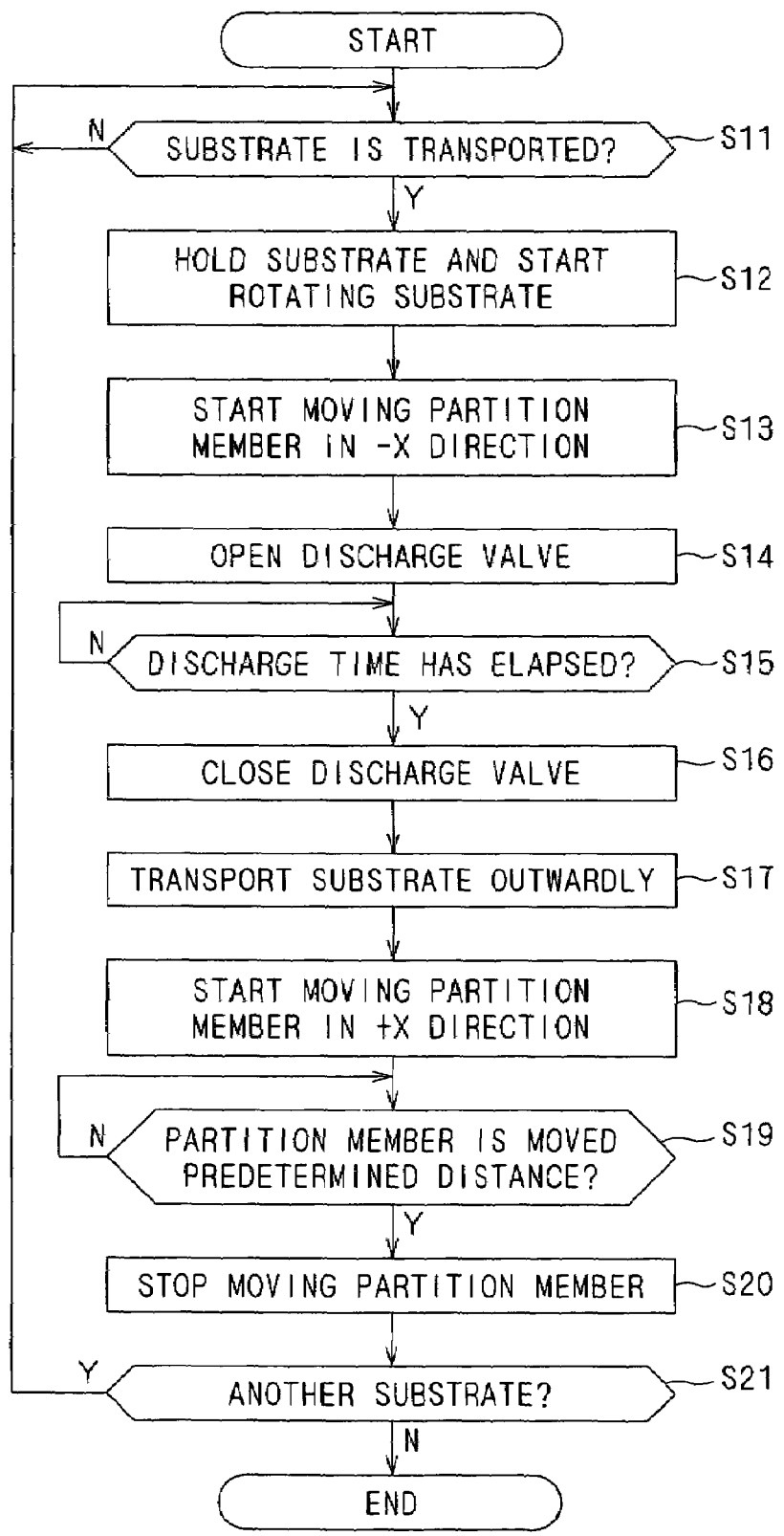
FIG. 8 is a flowchart showing the details of the operation of the coating processing unit according to the first preferred embodiment.

The construction of the coating processing unit SC1 according to the first preferred embodiment has been described above. Next, the operation of the coating process in the coating processing unit SC1 will be described. FIG. 8 is a flowchart showing the details of the operation of the coating processing unit SC1 according to the first preferred embodiment. Unless otherwise specified, the controller CR is assumed to effect the control of the operation of the following components.

In the coating processing unit SC1, a judgment is initially made as to whether or not a substrate W subjected to the cooling process is transported from the cooling unit CP1 by the transport robot TR (in Step S11). If the substrate W is transported, the chuck 15 holds the substrate W, and the spin motor 16 starts rotating the substrate W (in Step S12).

Next, the motor 230 of the drive mechanism 23 starts rotating to move the partition member 22 in the −X direction, thereby driving the resist solution (in Step S13). While the resist solution is driven, the discharge valve 13 is opened to discharge the resist solution through the nozzle 14 (in Step S14).

Figure 9A:
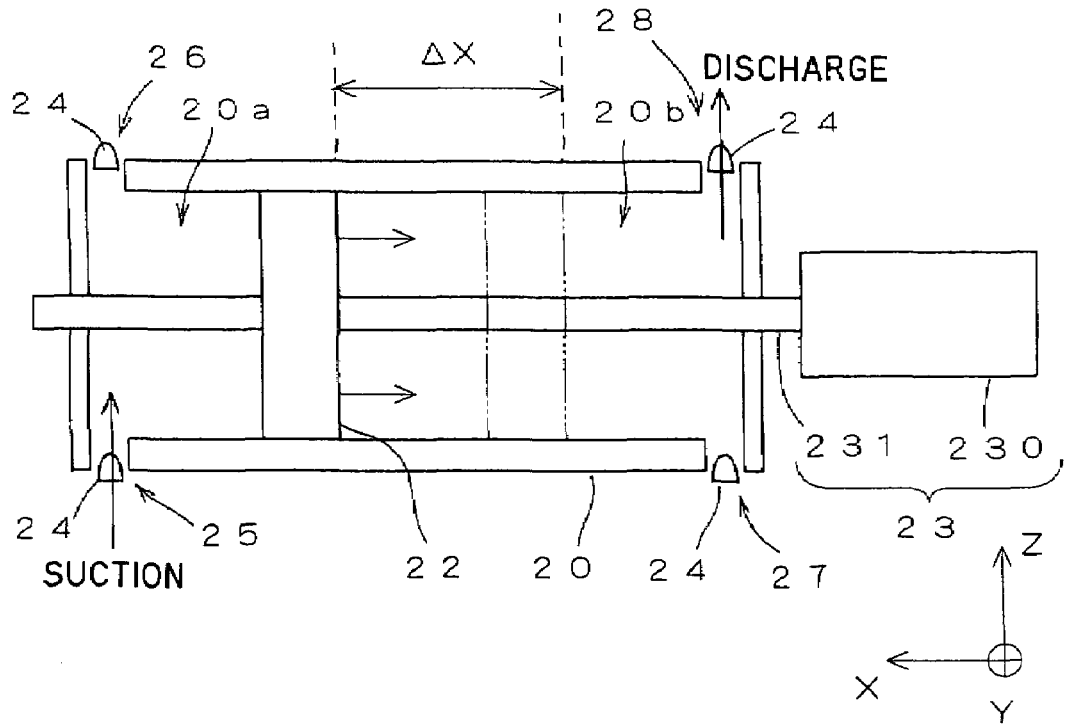
FIGS. 9A and 9B show the operation of the chemical pump of FIG. 6.
Figure 9B:
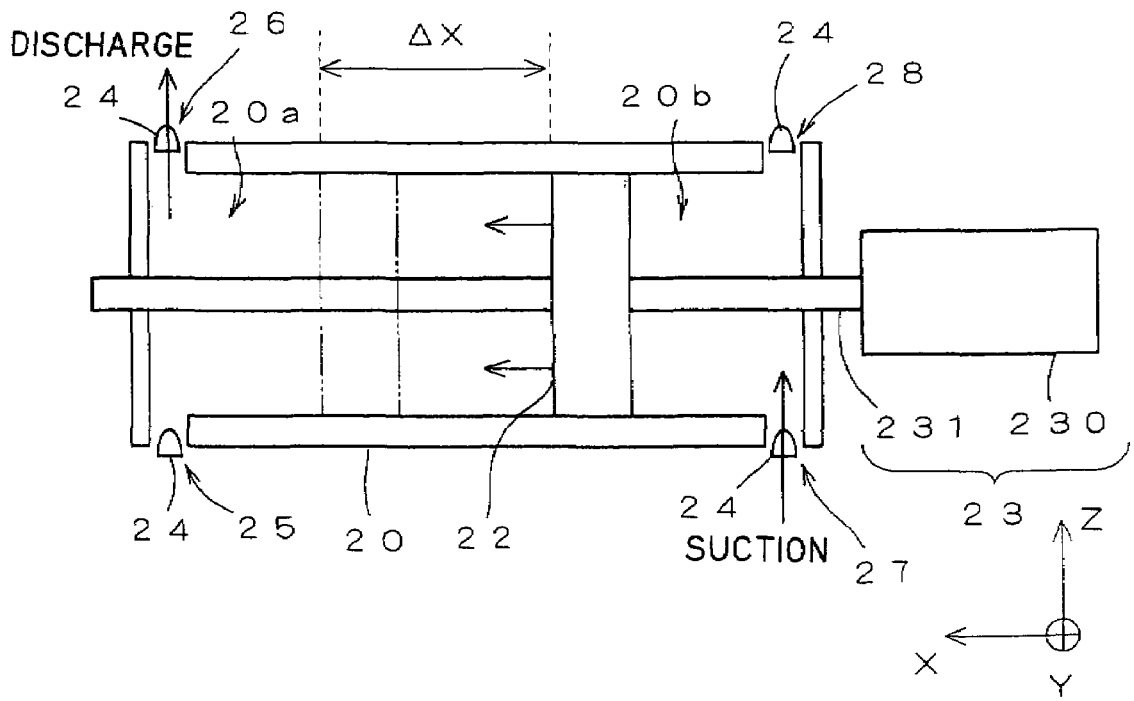

FIGS. 9A and 9B show the operation of the chemical pump 12. Prior to the coating process, the partition member 22 in the chemical pump 12 is moved by the motor 230 to the position indicated by the solid lines of FIG. 9A as an initial position. The volume Va of the cleaning pressure chamber 20a and the volume Vb of the discharging pressure chamber 20b at this time are denoted by Va1 and Vb1, respectively.

As the partition member 22 moves in the −X direction in Step S13, the ratio between the volume Va of the cleaning pressure chamber 20a and the volume Vb of the discharging pressure chamber 20b is varied, whereby the resist solution in the chemical pump 12 and the pipe is driven. The amount by which the volume Va of the cleaning pressure chamber 20a is increased and the amount by which the volume Vb of the discharging pressure chamber 20b is decreased at this time are denoted by $\Delta$Va1 and $\Delta$Vb1, respectively. Then, the movement of the partition member 22 in the −X direction increases the volume of the cleaning pressure chamber 20a by the amount $\Delta$Va1. Thus, the volume $\Delta$Va1 of the resist solution is sucked from the chemical bottle 11 through the opening 25 into the cleaning pressure chamber 20a. Since the volume of the discharging pressure chamber 20b is decreased by $\Delta$Vb1, the volume $\Delta$Vb1 of the resist solution is discharged through the opening 28. The resist solution discharged out of the discharging pressure chamber 20b is discharged through the nozzle 14 onto the main surface of the substrate W by opening the discharge valve 13 in Step S14, and spreads over the main surface of the substrate W by centrifugal force to form a resist film.

The operation of moving the partition member 22 in the −X direction is equivalent to the operation of sucking the resist solution into the chemical pump 12 and the operation of discharging the resist solution out of the chemical pump 12. The provision of the check valve 24 in each of the openings 26 and 27 as described above prevents the backflow of the resist solution through the opening 26 into the cleaning pressure chamber 20a and the discharge of the resist solution through the opening 27 out of the discharging pressure chamber 20b.

Since no filter is provided on the secondary side (between the opening 28 and the nozzle 14) of the chemical pump 12 in the coating processing unit SC1 according to the first preferred embodiment as shown in FIG. 5, the discharge rate of the resist solution during the discharge of the resist solution onto the substrate W depends only on the speed of movement of the partition member 22. Therefore, the controller CR which controls the speed of rotation of the motor 230 so that the speed of movement of the partition member 22 satisfies the same conditions in every coating process can insure the repeatability of the resist solution discharge rate distribution without being affected by the change of the filter 210 with time.

When the discharge of the resist solution through the nozzle 14 starts, the controller CR judges whether or not predetermined discharge time T has elapsed (in Step S15). After the lapse of the predetermined discharge time T, the controller CR closes the discharge valve 13 and stops the movement of the partition member 22, to thereby stop the discharge of the resist solution (in Step S16). It is assumed that the partition member 22 moves to the position indicated by the dash-double-dot lines of FIG. 9A (or the position indicated by the solid lines of FIG. 9B) during the discharge time T.

The speed of movement of the partition member 22 and the discharge time T are values whose repeatability can be insured in every coating process. The distance $\Delta$X the partition member 22 moves during the discharge of the resist solution (during the lapse of the discharge time T) is accordingly a repeatable value. Since the partition member 22 is made of the material which undergoes a negligible change in volume and shape as described above, the distance the surface of the partition member 22 on the discharging pressure chamber 20b side moves when the partition member 22 moves the distance $\Delta$X is also the same distance $\Delta$X, and satisfies $$\Delta Vb1 = Sb \times \Delta X \qquad (2)$$

Because of the negligible change in shape of the partition member 22, the surface area Sb is a constant value. Accordingly, the repeatability of the total discharge amount $\Delta$Vb1 of the resist solution is also insured in the coating processing unit SC1. Additionally, the controller CR judges the discharge timing of the resist solution based on the speed of rotation of the substrate W while controlling the spin motor 16. Therefore, the repeatability of the discharge timing of the resist solution is also insured.

As discussed above, the discharge amount, the discharge timing, the discharge time, the average discharge rate and the discharge rate distribution are managed with good repeatability in the coating processing unit SC1. Thus, the coating processing unit SC1 can form the coating films of resist solution on respective substrates W with good repeatability. Further, these conditions are established without any difference between apparatuses. Thus, when substrates W are processed in the plurality of coating processing units SC1 and SC2, for example, as in the substrate processing apparatus 1 according to the first preferred embodiment, the coating processing units SC1 and SC2 can form substantially identical coating films on the respective substrates W. The accuracy of the coating process is improved by previously determining the conditions for the formation of a desired coating film by experiment and performing the coating process based on the conditions with good repeatability.

Next, the substrate W subjected to the resist coating process is transported by the transport robot TR from the coating processing unit SC1 to the heating unit HP1 (in Step S17). In the coating processing unit SC, the motor 230 starts moving the partition member 22 in the +X direction (in Step S18) in parallel with the transport of the substrate W by the transport robot TR. Prior to the execution of Step S18, the partition member 22 is previously located in the position indicated by the solid lines of FIG. 9B in Step S113. The volume Va of the cleaning pressure chamber 20a and the volume Vb of the discharging pressure chamber 20b at this time are denoted by Va2 and Vb2, respectively.

When the partition member 22 is moved in the +X direction in Step S18, the ratio between the volume Va of the cleaning pressure chamber 20a and the volume Vb of the discharging pressure chamber 20b is varied again, whereby the resist solution is driven. The amount by which the volume Va of the cleaning pressure chamber 20a is decreased and the amount by which the volume Vb of the discharging pressure chamber 20b is increased at this time are denoted by $\Delta Va2$ and $\Delta Vb2$, respectively. Then, the movement of the partition member 22 in the +X direction increases the volume Vb of the discharging pressure chamber 20b by the amount $\Delta Vb2$. Since the partition member 22 does not allow the direct passage of the resist solution, the volume $\Delta Vb2$ of the resist solution is sucked from the secondary side of the filter part 21 through the opening 27. However, since the volume Va of the cleaning pressure chamber 20a is decreased by $\Delta Va2$ at the same time, the volume $\Delta Va2$ of the resist solution is supplied through the opening 26 to the primary side of the filter part 21.

The provision of the check valve 24 in each of the openings 25 and 28 as described above prevents the discharge of the resist solution through the opening 25 out of the cleaning pressure chamber 20a and the backflow of the resist solution through the opening 28 into the discharging pressure chamber 20b.

The operation of moving the partition member 22 in the +X direction is equivalent to the operation of the discharging pressure chamber 20b previously sucking an amount of the resist solution by which the nozzle 14 will discharge in the next coating process. This operation is also equivalent to the operation of the filter 210 removing the bubbles and contaminants from the resist solution to clean the resist solution because the cleaning pressure chamber 20a supplies the resist solution through the filter part 21 to the discharging pressure chamber 20b.

When the partition member 22 is moved to the position indicated by the dash-double-dot lines of FIG. 9B, then $$Va1 = Va2 - \Delta Va2 \quad (3)$$

$$Vb1 = Vb2 + \Delta Vb2 \quad (4)$$

hold.

Since the volume V of the pressure chamber 20 is constant in the coating processing unit SC1 according to the first preferred embodiment, $$V = Va1 + Vb1 = Va2 + Vb2 \quad (5)$$

holds.

From Equations (3) through (5), $$\Delta Va2 = \Delta Vb2 \quad (6)$$

holds.

Thus, the ratio between the volume Va of the cleaning pressure chamber 20a and the volume Vb of the discharging pressure chamber 20b is varied by the movement of the partition member 22 in the +X direction, but the amounts $\Delta Va2$ and $\Delta Vb2$ of change may be made equal. Equation (6) may be also derived from $$\Delta Va2 = Sa \times \Delta X \quad (7)$$

$$\Delta Vb2 = Sb \times \Delta X \quad (8)$$

$$S = Sa = Sb \quad (9)$$

In the chemical pump 12 according to the first preferred embodiment as discussed above, control is effected to make the volume V of the pressure chamber 20 constant while the ratio between the volume Va of the cleaning pressure chamber 20a and the volume Vb of the discharging pressure chamber 20b is changed at will. Therefore, the same amount of resist solution as that sucked from the secondary side of the filter part 21 is supplied to the primary side of the filter part 21 as indicated by Equation (6).

This suppresses the reduction in pressure on the resist solution in the filter 210 to prevent the formation of bubbles in the resist solution. Therefore, the chemical pump 12 according to the first preferred embodiment can prevent the vapor lock and micro-bubble phenomena to improve the accuracy of the coating process without the need to provide a mechanism for removing bubbles similar to the filter 210 on the secondary side of the chemical pump 12.

Equations (3) through (9) hold accurately also during the movement of the partition member 22 since the partition member 22 is integrally constructed of the material which undergoes a negligible change in volume and shape and the single drive mechanism 23 is used to move the partition member 22. In other words, the first preferred embodiment can more precisely effect control to make the amount of resist solution supplied to the filter part 21 and the amount of resist solution sucked from the filter part 21 equal to each other, as compared with the synchronous control of a plurality of drive mechanisms by the controller CR for individual control of these amounts.

When the partition member 22 moves the predetermined distance ($\Delta X$) to the position indicated by the dash-double-dot lines of FIG. 9B (or the solid lines of FIG. 9A), the coating processing unit SC1 stops moving the partition member 22 (in Steps S19 and S20).

Then, a judgment is made as to whether or not there is another substrate W to be subjected to the coating process in the substrate processing apparatus 1 (in Step S21). If there is another substrate W to be processed, the processing returns to Step S11 to repeat the above-mentioned process. If there is no substrate W to be processed, the processing is terminated.

The substrate processing apparatus 1 according to the first preferred embodiment performs the above-mentioned steps to supply to the primary side of the filter part 21 the same amount of resist solution as that sucked from the secondary side of the filter part 21. If the filter part 21 is positioned on the primary side of the discharging pressure chamber 20b when the discharging pressure chamber 20b sucks the resist solution, the substrate processing apparatus 1 according to the first preferred embodiment prevents the reduction in pressure in the filter 210 to suppress the formation of bubbles in the resist solution. This suppresses the vapor lock and micro-bubble phenomena without the need to locate the filter part 21 on the secondary side of the chemical pump 12. Since the discharge rate distribution during the discharge of the resist solution is not affected by the change of the filter with time or other conditions, the substrate processing apparatus 1 according to the first preferred embodiment is capable of insuring the repeatability of the coating film thickness to improve the accuracy of the coating process.

Additionally, the coating processing unit SC1 of the substrate processing apparatus 1 uses the single drive mechanism 23 to perform the operations of supplying the resist solution to the primary side of the filter part 21 and of sucking the resist solution from the secondary side of the filter part 21, thereby effecting more precise control as compared with the use of a plurality of drive mechanisms.

Although the pressure chamber 20 according to the first preferred embodiment which is made of a rigid material is not changed in shape or the like by driving the partition member 22, the pressure chamber 20 may be constructed to change its shape as the partition member 22 moves, so long as the volume V of the pressure chamber 20 is constant.

Figure 10A:
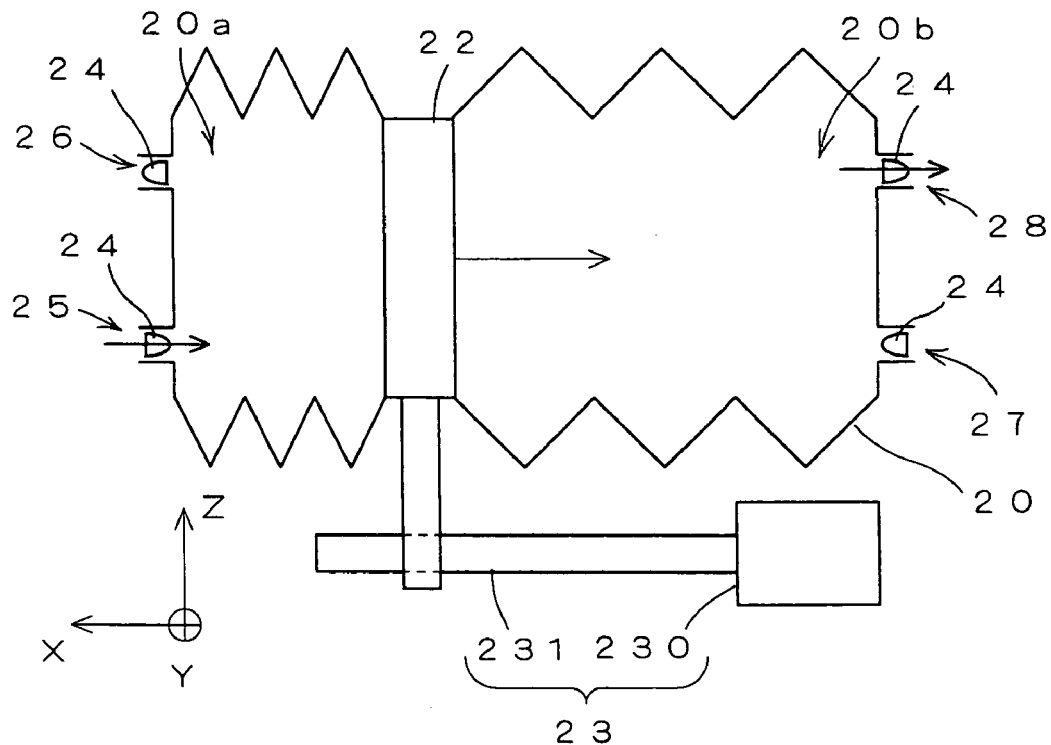
FIGS. 10A and 10B are schematic views of a chemical pump according to a second preferred embodiment of the present invention.
Figure 10B:
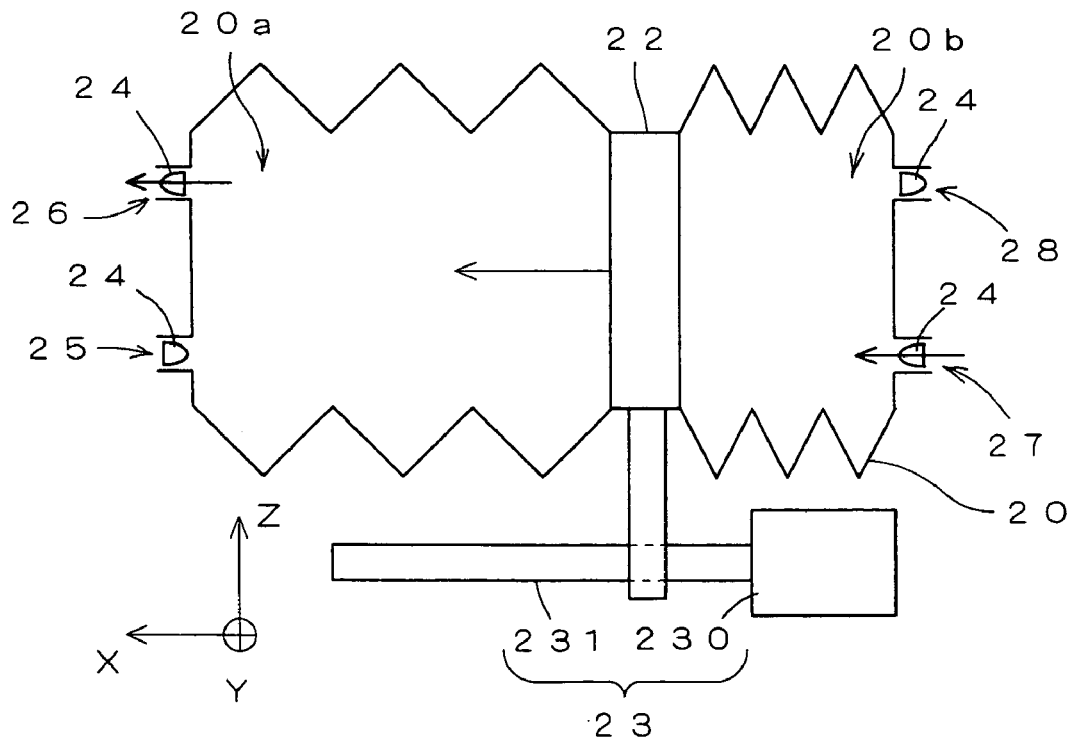

FIGS. 10A and 10B are schematic views of the chemical pump 12 according to a second preferred embodiment of the present invention which is constructed based on the above principle. Like reference numerals and characters are used in the second and subsequent preferred embodiments to designate components similar in function to those of the first preferred embodiment.

With reference to FIGS. 10A and 10B, the pressure chamber 20 of the chemical pump 12 according to the second preferred embodiment is constructed of a bellows-like member capable of expanding and contracting in the X direction. As in the first preferred embodiment, the pressure chamber 20 is divided by the partition member 22 into the cleaning pressure chamber 20a and the discharging pressure chamber 20b, and the components of the cleaning pressure chamber 20a and the components of the discharging pressure chamber 20b are mirror images of each other.

The outer end (or the left-hand end as viewed in FIGS. 10A and 10B) of the cleaning pressure chamber 20a on the positive side of the X direction and the outer end (or the right-hand end as viewed in FIGS. 10A and 10B) of the discharging pressure chamber 20b on the negative side of the X direction (i.e., the outer ends to which check valves 24 are attached) are fixed in predetermined positions within the coating processing unit SC1. The inner end (or the right-hand end as viewed in FIGS. 10A and 10B) of the cleaning pressure chamber 20a on the negative side of the X direction and the inner end (or the left-hand end as viewed in FIGS. 10A and 10B) of the discharging pressure chamber 20b on the positive side of the X direction are attached to the partition member 22.

The chemical pump 12 according to the second preferred embodiment is constructed in this manner. Thus, when the partition member 22 is moved in the X direction, the volume ratio between the cleaning pressure chamber 20a and the discharging pressure chamber 20b is varied depending on the X-axis position of the partition member 22, and the resist solution is driven by the operation of moving the partition member 22. However, the length of the pressure chamber 20 in the X direction is unchanged, and the amount of change in the volume Va of the cleaning pressure chamber 20a is equal to the amount of change in the volume Vb of the discharging pressure chamber 20b. The volume V of the pressure chamber 20 is constant.

The partition member 22 is made of a material which is not changed in shape and the like as in the first preferred embodiment. The partition member 22 is mounted to the guide member 231 of the drive mechanism 23 provided outside the pressure chamber 20 so as to be movable in the X direction. The rotation of the motor 230 moves the partition member 22 in the X direction along the guide member 231.

The check valves 24 have the function of passing the resist solution only in one direction as in the first preferred embodiment, but differ in orientation from those of the chemical pump 12 of the first preferred embodiment, as shown in FIGS. 10A and 10B. The check valves 24 mounted in the openings 25 and 28 are oriented to pass the resist solution in the −X direction, whereas the check valves 24 mounted in the openings 26 and 27 are oriented to pass the resist solution in the +X direction.

With such an arrangement, when the drive mechanism 23 drives the partition member 22 in the −X direction as shown in FIG. 10A, the cleaning pressure chamber 20a expands to increase in volume Va. Then, the pressure in the cleaning pressure chamber 20a is reduced to cause the resist solution to be supplied from the chemical bottle 11 through the opening 25 into the cleaning pressure chamber 20a. At this time, the discharging pressure chamber 20b contacts to decrease in volume Vb. Then, pressure is applied to the interior of the discharging pressure chamber 20b to cause the resist solution to be discharged from the discharging pressure chamber 20b through the opening 28 toward the nozzle 14.

On the other hand, when the drive mechanism 23 drives the partition member 22 in the +X direction as shown in FIG. 10B, the discharging pressure chamber 20b expands to increase in volume Vb. Then, the pressure in the discharging pressure chamber 20b is reduced to cause the resist solution to be sucked from the secondary side of the filter part 21 through the opening 27 into the discharging pressure chamber 20b. At this time, the cleaning pressure chamber 20a contacts to decrease in volume Va. Then, pressure is applied to the interior of the cleaning pressure chamber 20a to cause the resist solution to be supplied from the cleaning pressure chamber 20a through the opening 26 to the primary side of the filter part 21. Since the amount by which the volume Va of the cleaning pressure chamber 20a is decreased is equal to the amount by which the volume Vb of the discharging pressure chamber 20b is increased, the amount of resist solution sucked from the secondary side of the filter part 21 is equal to the amount of resist solution supplied to the primary side of the filter part 21.

As described above, the chemical pump 12 according to the second preferred embodiment has the structure in which the shape of the pressure chamber 20 is changed as the partition member 22 moves, but the volume V of the pressure chamber 20 is constant. Such a structure can supply to the primary side of the filter part 21 the same amount of resist solution as that sucked from the secondary side of the filter part 21. Therefore, the second preferred embodiment produces effects similar to those of the substrate processing apparatus 1 according to the first preferred embodiment. The provision of the drive mechanism 23 outside the pressure chamber 20 prevents particles or the like from entering the resist solution.

Although the partition member 22 according to the first and second preferred embodiments is made of the material which undergoes a negligible change in volume and shape, the partition member 22 is not limited to this, but may be constructed to change in shape and the like.

Figure 11A:
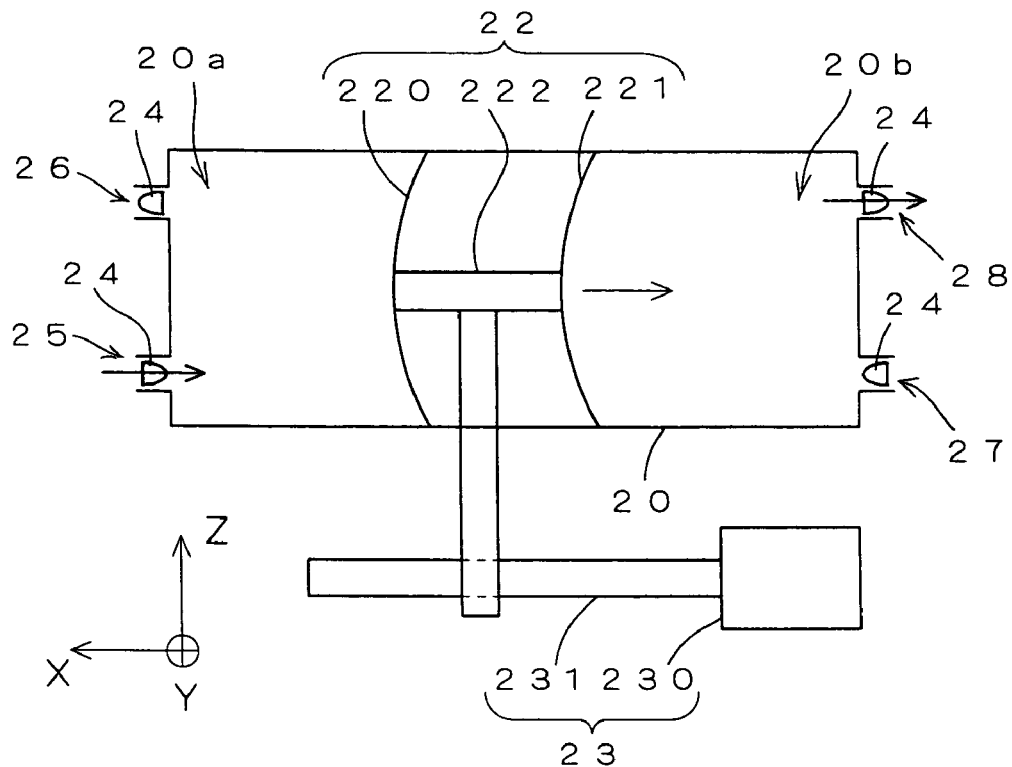
FIGS. 11A and 11B are schematic views of a chemical pump according to a third preferred embodiment of the present invention.
Figure 11B:
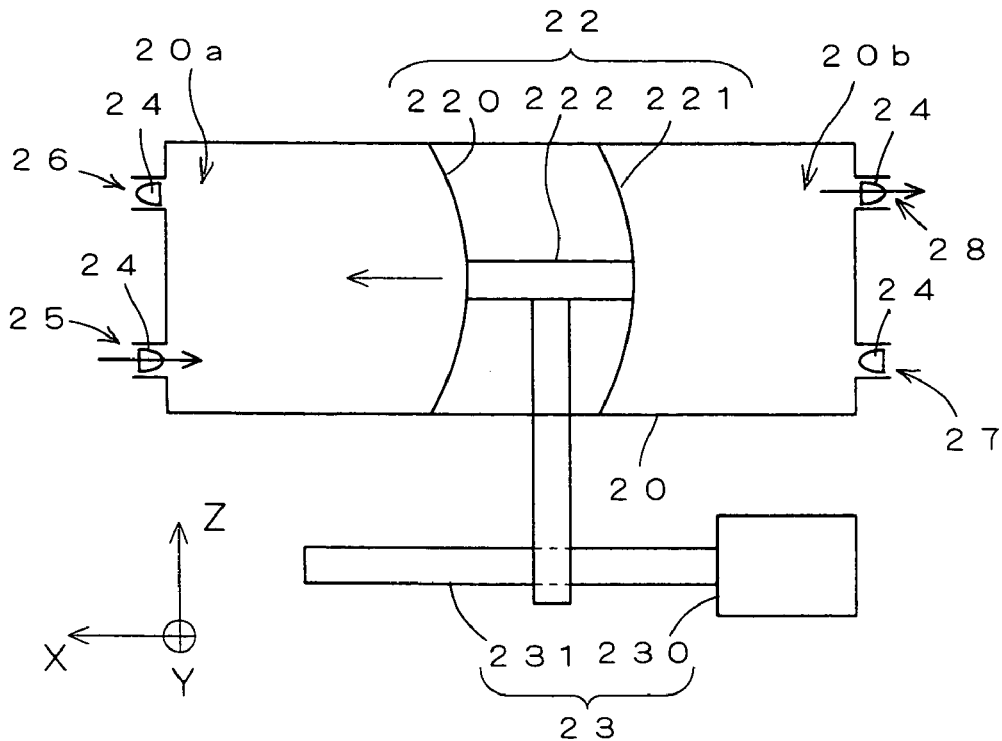

FIGS. 11A and 11B are schematic views of the chemical pump 12 according to a third preferred embodiment of the present invention which is constructed based on the above principle.

The pressure chamber 20 of the chemical pump 12 according to the third preferred embodiment is constructed of a tubular rigid member, and is divided by the partition member 22 having a pair of filmy members 220 and 221 into the cleaning pressure chamber 20a and the discharging pressure chamber 20b. The pair of filmy members 220 and 221 are fixed at their peripheral portions to the inner walls of the pressure chamber 20, and are coupled to each other at their central portions by a support member 222. The support member 222 is mounted to the guide member 231 of the drive mechanism 23 provided outside the pressure chamber 20 so as to be movable in the X direction. The rotation of the motor 230 moves the partition member 22 in the X direction along the guide member 231.

The use of the partition member 22 having such a structure effects the following operation. When the drive mechanism 23 drives the support member 222 of the partition member 22 in the −X direction as shown in FIG. 11A, the filmy member 220 on the cleaning pressure chamber 20a side is deformed to convex in the −X direction, thereby increasing the volume Va of cleaning pressure chamber 20a. Then, the pressure in the cleaning pressure chamber 20a is reduced to cause the resist solution to be supplied from the chemical bottle 11 through the opening 25 into the cleaning pressure chamber 20a. At this time, the filmy member 221 on the discharging pressure chamber 20b side is deformed similarly (while being maintained in geometrically similar form) to decrease the volume Vb of the discharging pressure chamber 20b. Then, pressure is applied to the interior of the discharging pressure chamber 20b to cause the resist solution to be discharged from the discharging pressure chamber 20b through the opening 28 toward the nozzle 14.

On the other hand, when the drive mechanism 23 drives the support member 222 of the partition member 22 in the +X direction as shown in FIG. 11B, the filmy member 220 on the cleaning pressure chamber 20a side is deformed to convex in the +X direction, thereby decreasing the volume Va of cleaning pressure chamber 20a. Then, pressure is applied to the interior of the cleaning pressure chamber 20a to cause the resist solution to be supplied from the cleaning pressure chamber 20a through the opening 26 to the primary side of the filter part 21. At this time, the filmy member 221 on the discharging pressure chamber 20b side is deformed similarly to increase the volume Vb of the discharging pressure chamber 20b. Then, the pressure in the discharging pressure chamber 20b is reduced to cause the resist solution to be sucked from the secondary side of the filter part 21 through the opening 27 into the discharging pressure chamber 20b.

As described above, the chemical pump 12 according to the third preferred embodiment sucks and discharges the resist solution by changing the shape of the partition member 22, but is structured so that the volume V of the pressure chamber 20 is constant. Such a structure can supply to the primary side of the filter part 21 the same amount of resist solution as that sucked from the secondary side of the filter part 21. Therefore, the third preferred embodiment produces effects similar to those of the substrate processing apparatus 1 according to the first preferred embodiment.

For suppression of the vapor lock and micro-bubble phenomena, it is also effective to sufficiently remove air trapped in a pipe and a filter when starting to drive the apparatus.

FIGS. 12 through 14 show the chemical pump 12 and a piping system 50 in the coating processing unit SC1 according to a fourth preferred embodiment of the present invention which is constructed based on the above principle.

Although the chemical pump 12 of the fourth preferred embodiment is similar in construction to that of the first preferred embodiment, the chemical pump 12 of the second or third preferred embodiment may be used instead.

The piping system 50 includes pipes 51 to 53, switching valves 54 and 55, and an on-off valve 56. The switching valves 54 and 55 and the on-off valve 56 are controlled by the controller CR.

The pipe 51 provides a connection between the chemical bottle 11 and the opening 27 of the discharging pressure chamber 20b, and the pipe 52 provides a connection between the opening 26 of the cleaning pressure chamber 20a and the opening 28 of the discharging pressure chamber 20b. The pipe 53 is connected to a blower not shown for purging air from the filter 210.

The switching valve 54 includes on-off valves 540 and 541, and allows selection as to whether to suck the resist solution to be directed to the opening 27 of the discharging pressure chamber 20b from the chemical bottle 11 or from the secondary side of the filter 210. Specifically, for the suction from the chemical bottle 11, the on-off valve 540 is opened and the on-off valve 541 is closed (in a maintenance state), as shown in FIGS. 12 and 13. For the suction from the secondary side of the filter 210, on the other hand, the on-off valve 540 is closed and the on-off valve 541 is opened (in a normal state), as shown in FIG. 14.

The switching valve 55 includes on-off valves 550 and 551, and allows selection as to whether to supply the resist solution discharged through the opening 28 of the discharging pressure chamber 20b to the primary side of the filter 210 or to the nozzle 14. Specifically, for the supply to the primary side of the filter 210, the on-off valve 550 is opened and the on-off valve 551 is closed (in the maintenance state), as shown in FIGS. 12 and 13. For the supply to the nozzle 14, on the other hand, the on-off valve 550 is closed and the on-off valve 551 is opened (in the normal state), as shown in FIG. 14.

The on-off valve 56 is open (in the maintenance state) when purging air by the above-mentioned blower; otherwise, the on-off valve 56 is closed (in the normal state). The switching valves 54 and 55 and the on-off valve 56 are connected to the controller CR, and are switched between the maintenance state and the normal state, based on a control signal from the controller CR. In other words, the controller CR is principally equivalent to a switching element according to the present invention, and the switching valves 54 and 55 and the on-off valve 56 are principally equivalent to an opening and closing element according to the present invention.

Figure 16:
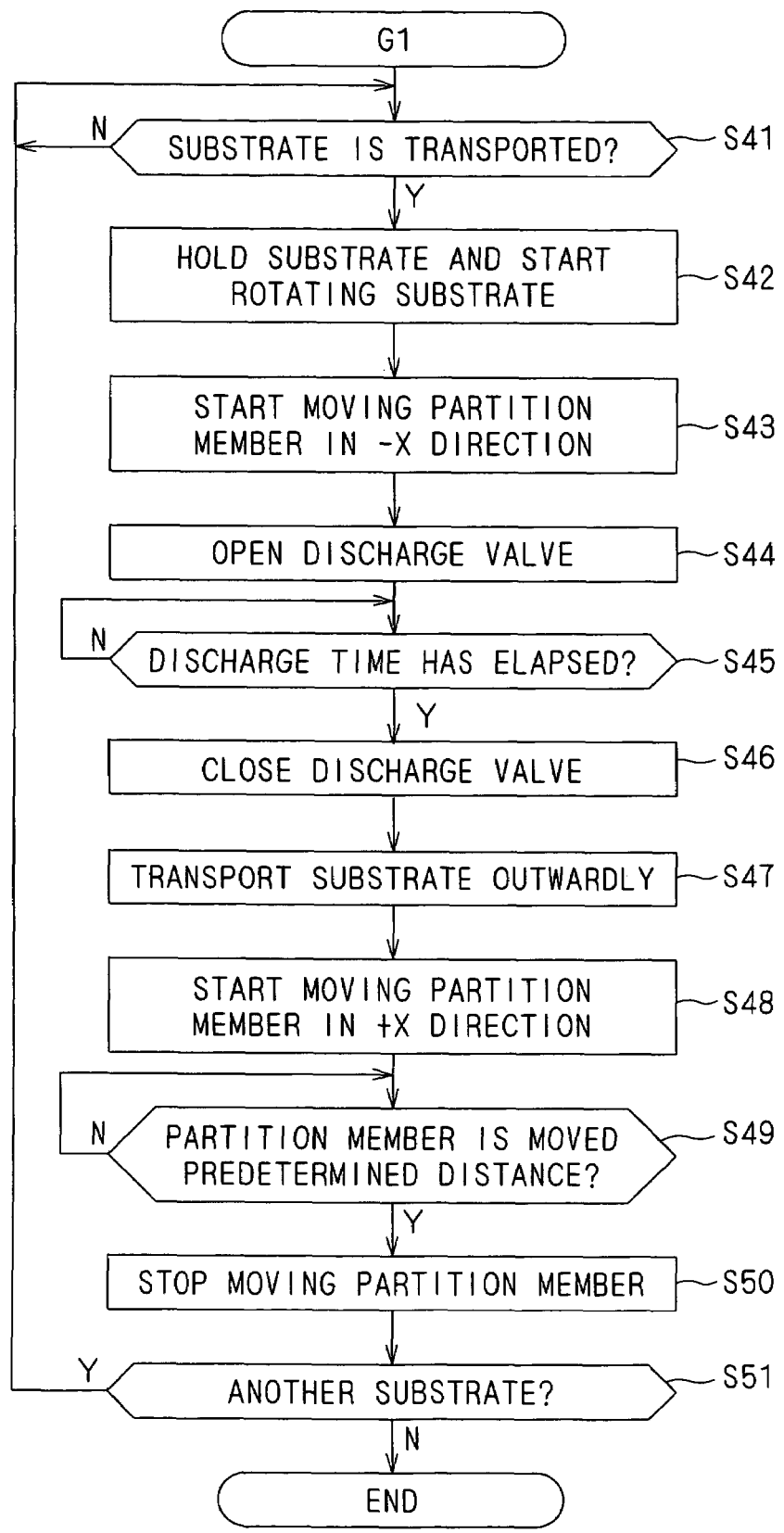
Figure 17:
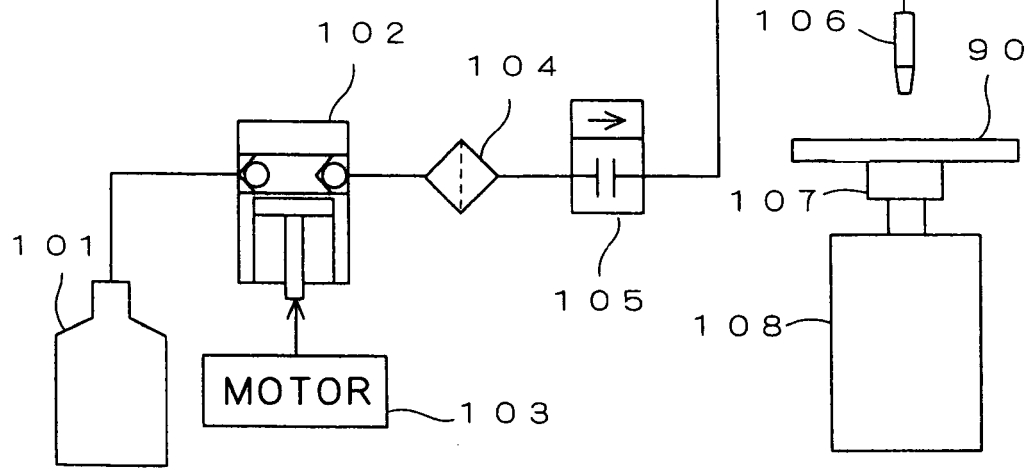
FIG. 17 shows the construction of a background art substrate processing unit which is a typical spin coater.
Figure 18:
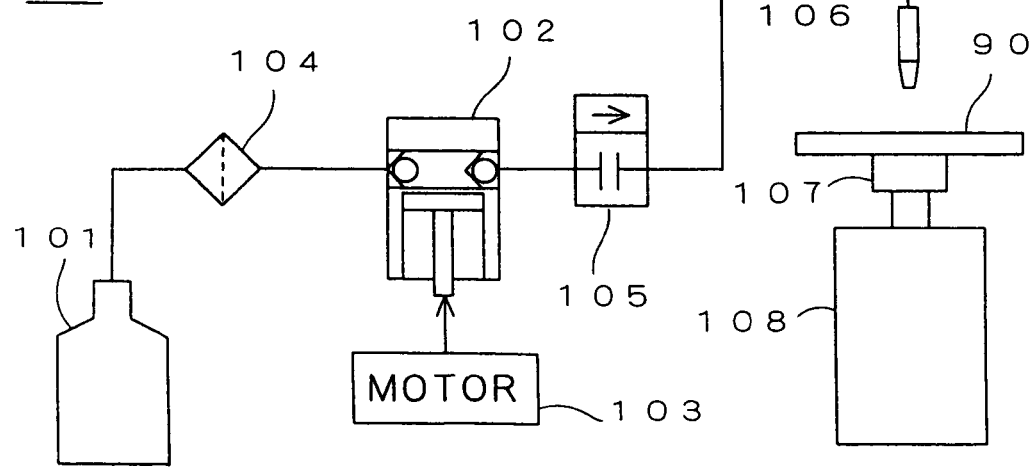
FIG. 18 shows the construction of a background art substrate processing unit having a filter disposed on the primary side.

The construction of, in particular, the chemical pump 12 and the piping system 50 according to the fourth preferred embodiment has been described. Next, the operation of the substrate processing apparatus 1 according to the fourth preferred embodiment will be described. FIGS. 15 and 16 are flowcharts showing the operation of the coating processing unit SC1 according to the fourth preferred embodiment.

In the coating processing unit SC1, the controller CR initially opens or closes each of the switching valves 54 and 55 and the on-off valve 56 to place the valves 54, 55 and 56 in the maintenance state and to switch the piping system 50 to a maintenance mode (in Step S31). Thus, each of the valves 54, 55 and 56 is in an open or closed position shown in FIGS. 12 and 13.

Next, the drive mechanism 23 moves the partition member 22 in the X direction, and the above-mentioned blower exerts suction on the pipe 53, thereby to drive the resist solution and to purge air from the piping and the filter 210 (in Step S32).

Step S32 will be described in detail. While the partition member 22 moves in the −X direction as shown in FIG. 12, the pressure in the cleaning pressure chamber 20a is reduced, and pressure is applied to the interior of the discharging pressure chamber 20b. At this time, since the check valve 24 is provided in the opening 27 and the on-off valve 541 of the switching valve 54 is closed, the resist solution is supplied from the chemical bottle 11 through the opening 25 into the cleaning pressure chamber 20a. The resist solution discharged through the opening 28 of the discharging pressure chamber 20b, on the other hand, is supplied through the pipe 52 to the secondary side of the filter 210 since the on-off valve 551 of the switching valve 55 is closed and the check valve 24 is provided in the opening 26. Since the on-off valve 56 is open and the on-off valve 541 of the switching valve 54 is closed, the resist solution supplied to the secondary side of the filter 210 passes through the pipe 53 and is sucked by the blower not shown, whereby air is purged.

While the partition member 22 moves in the +X direction as shown in FIG. 13, pressure is applied to the interior of the cleaning pressure chamber 20a, and the pressure in the discharging pressure chamber 20b is reduced. At this time, since the on-off valve 551 of the switching valve 55 is closed and the check valve 24 is provided in the opening 28, the resist solution discharged through the opening 26 of the cleaning pressure chamber 20a is supplied to the secondary side of the filter 210. Since the on-off valve 56 is open and the on-off valve 541 of the switching valve 54 is closed, the resist solution supplied to the secondary side of the filter 210 passes through the pipe 53 and is sucked by the blower not shown, whereby air is purged, as discussed above. On the other hand, the resist solution is supplied from the chemical bottle 11 through the pipe 51 and the opening 27 into the discharging pressure chamber 20b since the on-off valve 541 of the switching valve 54 is closed and the check valve 24 is provided in the opening 25.

In this manner, while the partition member 22 of the chemical pump 12 moves in either direction, the resist solution flows through the piping between the chemical bottle 11 and the chemical pump 12 and through the filter 210. Therefore, the substrate processing apparatus 1 can achieve the air purge in a shorter time than the conventional apparatuses which alternately sucks and discharges the resist solution. Additionally, since the resist solution does not stand still for a while during the air purge, the substrate processing apparatus 1 prevents the problem shown in FIGS. 19A to 19C such that an air bubble returns to the original position while the resist solution stands still, thereby to sufficiently purge air from the piping prior to the coating process. This prevents the vapor lock and micro-bubble phenomena in the coating process.

In the coating processing unit SC1, Step S32 is repeated until a lapse of predetermined time (in Step S33). After the lapse of the predetermined time, the drive mechanism 23 moves the partition member 22 to its initial position (corresponding to the position indicated by the solid lines of FIG. 9A), and the controller CR opens or closes each of the switching valves 54 and 55 and the on-off valve 56, thereby to place the valves 54, 55 and 56 in the normal state and to switch the piping system 50 to a normal mode (in Step S34). Thus, each of the valves 54, 55 and 56 is in an open or closed position shown in FIG. 14. The switching to the normal mode places the chemical pump 12 and the piping system 50 in the coating processing unit SC1 in the fourth preferred embodiment into similar piping conditions to the chemical pump 12 (See FIG. 5) in the first preferred embodiment.

After the piping system 50 is switched to the normal mode in Step S34, the coating processing unit SC1 according to the fourth preferred embodiment performs processes similar to those (Steps S11 through S21 in FIG. 8) of the coating processing unit SC1 according to the first preferred embodiment.

These processes will be briefly described. The coating processing unit SC1 waits until a substrate W is transported thereto by the transport robot TR (in Step S41). After the substrate W is transported, the coating processing unit SC1 holds the substrate W, and thereafter starts rotating the substrate W (in Step S42). When the rpm of the substrate W reaches a predetermined value, the partition member 22 is moved in the −X direction to drive the resist solution, and the discharge valve 13 is opened to discharge the resist solution through the nozzle 14 toward the substrate W until a lapse of predetermined time (Steps S43 through S45).

After the lapse of the predetermined time, the discharge valve 13 is closed, and the substrate W is transported out of the coating processing unit SC1 (in Steps S46 and S47). Then, the partition member 22 is moved a predetermined distance in the +X direction to drive the resist solution, whereby the filter 210 cleans the resist solution (in Steps S48 and S49). At this time, the chemical pump 12 supplies from the cleaning pressure chamber 20a to the primary side of the filter 210 the same amount of resist solution as that sucked from the secondary side of the filter 210 into the discharging pressure chamber 20b. Therefore, the fourth preferred embodiment can also suppress the formation of bubbles without the reduction in pressure on the resist solution in the filter 210.

When the partition member 22 is moved to a predetermined position (or the position shown in FIG. 14), the partition member 22 is stopped (Step S50). Then, a judgment is made as to whether or not there is another substrate W to be subjected to the coating process in the substrate processing apparatus 1 (in Step S51). If there is another substrate W to be processed, the processing returns to Step S41 to repeat the above-mentioned process. If there is no substrate W to be processed, the processing is terminated.

As above discussed, the substrate processing apparatus 1 according to the fourth preferred embodiment can also produce effects similar to those of the first to third preferred embodiments.

Changing the piping system 50 into the maintenance mode allows the resist solution to be driven in the piping between the chemical bottle 11 and the chemical pump 12 and in the filter 210 while the partition member 22 of the chemical pump 12 moves in either direction. Therefore, the substrate processing apparatus 1 can achieve the air purge in a shorter time than the conventional apparatuses which alternately sucks and discharges the resist solution.

Additionally, since the resist solution does not stand still for a while during the air purge, the substrate processing apparatus 1 prevents an air bubble from returning to the original position while the resist solution stands still, thereby to sufficiently purge air from the piping prior to the coating process. This prevents the vapor lock and micro-bubble phenomena in the coating process.

While the preferred embodiments of the present invention have been described above, the number and position of valves provided in the coating processing unit SC1 are not limited to those of the first to fourth preferred embodiments. As an example, an on-off valve which opens and closes in synchronism with the on-off valve 541 may be provided in the immediate vicinity of the secondary side of the filter 210 in the fourth preferred embodiment. The discharge valve 13 and the on-off valve 551 may be combined into a dual-purpose valve which opens and closes in timed relation to the opening and closing of the discharge valve 13.

In the fourth preferred embodiment, when to terminate the air purge in the maintenance mode is judged by time. However, an input part having, for example, a control button may be provided in the substrate processing apparatus 1 so that this judgment is made by operator's command input through the control button.

While the invention has been described in detail, the foregoing description is in all aspects illustrative and not restrictive. It is understood that numerous other modifications and variations can be devised without departing from the scope of the invention.

What is claimed is:

1. In combination with an acting element for exerting a predetermined action on a chemical solution, a chemical pump for pumping said chemical solution through said acting element, comprising:

a pressure chamber divided by a movable partition member into a first chamber and a second chamber;

a single driving element for driving said partition member to reciprocate, thereby changing a volume ratio between said first chamber and said second chamber while the sum of the volumes of said first and second chambers is held constant; and a pipe provided outside said pressure chamber, for passing said chemical solution between said first chamber and said second chamber, wherein said single driving element drives said partition member in such a manner that, when the volume of said first chamber decreases, the decreased volume of said first chamber is equal to an increased volume of said second chamber, and when the volume of said first chamber increases, the increased volume of said first chamber is equal to a decreased volume of said second chamber, and the chemical solution sucked and introduced into said first chamber by driving said partition member in a first direction is moved via said acting element inserted in said pipe into said second chamber by driving said partition member in a second direction, and is then discharged out of said second chamber by driving said partition member in said first direction again.

2. The chemical pump according to claim 1, wherein said single driving element drives said partition member by means of a driving force of a motor.

3. The chemical pump according to claim 1, wherein said acting element is a filter element.

4. The chemical pump according to claim 1, wherein said partition member prevents passage of said chemical solution between said first chamber and said second chamber inside said pressure chamber.

5. The chemical pump according to claim 1, wherein each of said first chamber and said second chamber is provided with a single sucking opening and a single discharging opening.

6. A piping system for directing a chemical solution to a predetermined processing part, comprising:

a pipe serving as a flow passage of said chemical solution;

a switching element for switching an operating mode of said piping system between a maintenance mode for purging air from said pipe and a normal mode for directing said chemical solution to said predetermined processing part; and an opening and closing element for opening and closing said pipe in accordance with said operating mode switched by said switching element, said pipe being connected to a chemical pump, said chemical pump being used in combination with an acting element for exerting a predetermined action on said chemical solution, said chemical pump pumping said chemical solution through said acting element, said chemical pump including a pressure chamber divided by a movable partition member into a first chamber and a second chamber, and a single driving element for driving said partition member to reciprocate, thereby changing a volume ratio between said first chamber and said second chamber while the sum of the volumes of said first and second chambers is held constant, wherein said single driving element drives said partition member in such a manner that, when the volume of said first chamber decreases, the decreased volume of said first chamber is equal to an increased volume of said second chamber, and when the volume of said first chamber increases, the increased volume of said first chamber is equal to a decreased volume of said second chamber, and the chemical solution sucked and introduced into said first chamber by driving said partition member in a first direction is moved via said acting element inserted in said pipe into said second chamber by driving said partition member in a second direction, and is then discharged out of said second chamber by driving said partition member in said first direction again.

7. A substrate processing unit comprising:

(a) a holding part for holding a substrate;

(b) a nozzle for discharging a chemical solution onto said substrate held by said holding part;

(c) a chemical solution reservoir for storing said chemical solution to be supplied to said nozzle;

(d) a piping system for directing said chemical solution to a predetermined processing part, said piping system including (d-1) a pipe serving as a flow passage of said chemical solution, (d-2) a switching element for switching an operating mode of said piping system between a maintenance mode for purging air from said pipe and a normal mode for directing said chemical solution to said predetermined processing part, and (d-3) an opening and closing element for opening and closing said pipe in accordance with said operating mode switched by said switching element; and (e) a chemical pump, connected to said pipe and used in combination with an acting element for exerting a predetermined action on said chemical solution, for pumping said chemical solution through said acting element, said chemical pump including (e-1) a pressure chamber divided by a movable partition member into a first chamber and a second chamber, and (e-2) a single driving element for driving said partition member to reciprocate, thereby changing a volume ratio between said first chamber and said second chamber while the sum of the volumes of said first and second chambers is held constant, wherein said single driving element drives said partition member in such a manner that, when the volume of said first chamber decreases, the decreased volume of said first chamber is equal to an increased volume of said second chamber, and when the volume of said first chamber increases, the increased volume of said first chamber is equal to a decreased volume of said second chamber, and the chemical solution sucked and introduced into said first chamber by driving said partition member in a first direction is moved via said acting element inserted in said pipe into said second chamber by driving said partition member in a second direction, and is then discharged out of said second chamber by driving said partition member in said first direction again.

8. A substrate processing apparatus for performing a series of processes upon a substrate, comprising:
   (a) a substrate processing unit including
   (a-1) a holding part for holding a substrate,
   (a-2) a nozzle for discharging a chemical solution onto said substrate held by said holding part,
   (a-3) a chemical solution reservoir for storing said chemical solution to be supplied to said nozzle,
   (a-4) a piping system for directing said chemical solution to a predetermined processing part, said piping system including
   (a-4-1) a pipe serving as a flow passage of said chemical solution,
   (a-4-2) a switching element for switching an operating mode of said piping system between a maintenance mode for purging air from said pipe and a normal mode for directing said chemical solution to said predetermined processing part, and
   (a-4-3) an opening and closing element for opening and closing said pipe in accordance with said operating mode switched by said switching element, and
   (a-5) a chemical pump, connected to said pipe and used in combination with an acting element for exerting a predetermined action on said chemical solution, for pumping said chemical solution through said acting element, said chemical pump including
   (a-5-1) a pressure chamber divided by a movable partition member into a first chamber and a second chamber, and
   (a-5-2) a single driving element for driving said partition member to reciprocate, thereby changing a volume ratio between said first chamber and said second chamber while the sum of the volumes of said first and second chambers is held constant;
   (b) a development processing unit for performing a development process on said substrate;
   (c) a heat treatment unit for performing heat treatment on said substrate; and
   (d) a transport element for transporting said substrate between said units, wherein said single driving element drives said partition member in such a manner that, when the volume of said first chamber decreases, the decreased volume of said first chamber is equal to an increased volume of said second chamber, and when the volume of said first chamber increases, the increased volume of said first chamber is equal to a decreased volume of said second chamber, and the chemical solution sucked and introduced into said first chamber by driving said partition member in a first direction is moved via said acting element inserted in said pipe into said second chamber by driving said partition member in a second direction, and is then discharged out of said second chamber by driving said partition member in said first direction again.

* * * * *